United States Patent
Helsloot

(10) Patent No.: US 8,965,011 B2
(45) Date of Patent: Feb. 24, 2015

(54) AUTOMATIC GAIN CONTROL CIRCUIT AND METHOD FOR AUTOMATIC GAIN CONTROL

(75) Inventor: Michiel Andre Helsloot, Hertogenbosch (NL)

(73) Assignee: Dialog Semiconductor B.V., 's-Hertogenbosch (NL)

(*) Notice: Subject to any disclaimer, the term of this patent is extended or adjusted under 35 U.S.C. 154(b) by 404 days.

(21) Appl. No.: 13/331,302

(22) Filed: Dec. 20, 2011

(65) Prior Publication Data

US 2012/0206195 A1    Aug. 16, 2012

(30) Foreign Application Priority Data

Feb. 11, 2011 (EP) .................................... 11154201
Nov. 17, 2011 (EP) .................................... 11189633

(51) Int. Cl.
*H03F 99/00*    (2009.01)
*H03G 9/02*    (2006.01)
*H03G 7/00*    (2006.01)

(52) U.S. Cl.
CPC .............. *H03G 9/025* (2013.01); *H03G 7/002* (2013.01)
USPC ............... 381/120; 381/91; 381/98; 381/103; 381/108; 379/406.01; 704/E21.02

(58) Field of Classification Search
CPC ............. H04R 3/02; H04R 3/04; H04R 3/06; H04R 3/08; H04R 3/14; H04R 3/007; H04R 5/04; H04R 25/453; H04R 25/50; H04R 25/505; H04R 25/507; H03G 5/00; H03G 5/005; H03G 5/16; H03G 5/165; H03G 5/24; H03G 5/28; H03G 9/005; H03G 9/24; H03G 9/025; H03G 2201/702; H03G 7/007; G10L 2021/02082; G10K 11/16
USPC ............ 381/28, 59, 55, 317, 318, 321, 71.11, 381/71.14, 74, 83, 332, 93, 96, 97, 98, 99, 381/100, 101, 102, 103, 106, 107, 108, 120, 381/121, 71.12, 71.7, 61, 66; 330/304, 303; 327/552, 555, 560; 704/E21.007, 704/E21.02; 379/406.01–406.16
See application file for complete search history.

(56) References Cited

U.S. PATENT DOCUMENTS 5,528,695 A * 6/1996 Klippel ........................... 381/55
6,201,873 B1 * 3/2001 Dal Farra ...................... 381/100
(Continued)

FOREIGN PATENT DOCUMENTS

DE    4336609    5/1995
JP    59108497    6/1984

OTHER PUBLICATIONS

European Search Report App. No. 11189633.8-1233 Mail date—Feb. 29, 2012.

(Continued)

*Primary Examiner* — Leshui Zhang
(74) *Attorney, Agent, or Firm* — Saile Ackerman LLC; Stephen B. Ackerman

(57) ABSTRACT

A method of attenuating an input signal to obtain an output signal is described. The method comprises receiving the input signal, attenuating the input signal with a gain factor to obtain the output signal, applying a filter having a frequency response with a frequency-dependent filter gain to at least one of a copy of the input signal and a copy of the output signal to obtain a filtered signal, the frequency-dependent filter gain being arranged to emphasize frequencies within a number N of predetermined frequency ranges, N>1; wherein the filter comprises a sequence of N sub-filters, each one of the N sub-filters having a frequency response adapted to emphasize frequencies within a corresponding one of the N predetermined frequency ranges; determining a signal strength of the filtered signal, and determining the gain factor from at least the signal strength.

12 Claims, 12 Drawing Sheets

(56) References Cited

U.S. PATENT DOCUMENTS

| | | |
|---|---|---|
| 6,744,882 B1 | 6/2004 | Gupta et al. |
| 7,013,011 B1 * | 3/2006 | Weeks et al. .................. 381/98 |
| 2005/0276425 A1 * | 12/2005 | Forrester et al. ............. 381/104 |
| 2006/0072769 A1 * | 4/2006 | Taniguchi .................... 381/104 |

OTHER PUBLICATIONS

European Search Report—11154201.5-2215 Mail date—Jul. 15, 2011.

Communication pursuant to Article 94(3) EPC 11 189 633.8-1805 Mailed: Dec. 19, 2013.

* cited by examiner

AUTOMATIC GAIN CONTROL CIRCUIT AND METHOD FOR AUTOMATIC GAIN CONTROL

BACKGROUND OF THE INVENTION (1) Field of Invention

The invention relates to an amplifier circuit and a method of amplification using automatic gain control.

(2) Description of the Prior Art

Many electrical circuits require a conditioning of a signal to obtain a conditioned signal that satisfies certain predetermined requirements as to e.g. signal level of the signal. For example, a transducer may perform optimally within a certain range of the signal level delivered to the transducer. For this purpose, it is known to use amplifier circuits and amplification methods that receive an input signal, amplify the input signal by a gain factor to obtain an output signal, deliver the output signal to an output terminal, e.g. connected to a transducer, determine a signal level of the output signal and determine the gain factor from at least the signal level. Such amplifier circuits and amplification methods are sometimes referred to as feedback gain control circuits and methods. Also, it is known to use amplifier circuits and amplification methods that receive an input signal, determine a signal level of the input signal, determine a gain factor from at least the signal level, amplify the input signal by a gain factor to obtain an output signal and deliver the output signal to an output terminal, e.g. connected to a transducer. Such amplifier circuits and amplification methods are sometimes referred to as feedforward gain control circuits and methods. For both feedback as well as feedforward gain control circuits and methods, the gain factor may relate the output signal level to the input signal level. It is known to determine the gain automatically in so-called automatic gain control (AGC) circuits and methods. The gain factor may e.g. be determined such that the signal level of the output signal is within a predetermined range, such as between a predetermined minimum target output level defining a lower threshold level and a predetermined maximum target output level defining an upper threshold level. In such case, the output signal may be delivered to the transducer with a signal level that is within the predetermined range, which may e.g. correspond to an optimal operation range of the transducer. The gain factor may also be determined in other ways, e.g., such that the signal level of the output signal is limited to remain below a predetermined maximum level defining a threshold ceiling level. In the latter case, the gain factor may e.g. be a first, constant factor as long as the input signal level is below a certain maximum input signal level, whereas the gain factor may e.g. be substantially inversely proportional to the input signal level when the input signal level is above the certain maximum input signal level, whereby the output signal level would exceed the predetermined maximum level if the gain factor would not be reduced below the first, constant factor. Hereby, the output signal is clipped to the predetermined maximum level, which may e.g. correspond to a maximum operation level of the transducer. Various methods and circuits are known wherein the gain factor may obtain only positive values, only negative values, or values of either sign, and where the gain factor may obtain (absolute) values that remain below zero and one, that remain above one, or that may obtain values ranging from below one to above one. As an example, it is known to use an amplifier circuit arranged to provide an output signal within a predetermined range to a speaker, wherein the output signal is obtained from amplifying an input signal with a gain factor determined in dependence on the signal level of the input signal.

It may be a disadvantage of known amplifier circuits and amplification methods that the amplification may not always be optimal. In particular, it has been found that, for known amplifier circuits and amplification methods, the transducer would have been capable to receive an output signal with a larger output signal level than obtained with the known amplifier circuit and amplification method, i.e. wherein the input signal could have been amplified more strongly.

SUMMARY OF THE INVENTION

The invention is described by the independent claims. Preferred Embodiments are described by the dependent claims.

Further aspects of the present document are a method of amplifying of an input signal to obtain an output signal, comprising
 a. receiving the input signal,
 b. amplifying the input signal with a gain factor to obtain the output signal, and
 c. applying a frequency-dependent filter having a transfer function with a frequency-dependent filter gain to at least one of a copy of the input signal and a copy of the output signal to obtain a filtered signal, the frequency-dependent filter gain being arranged to emphasize frequencies within a predetermined frequency range,
 d. determining a signal strength of the filtered signal, and
 e. determining the gain factor from at least the signal strength.

If the frequency-dependent filter is applied to a copy of the input signal, the method may be referred to as a feedforward method. Such feedforward method may thus comprise receiving the input signal, amplifying the input signal with a gain factor to obtain the output signal, and applying a frequency-dependent filter having a transfer function with a frequency-dependent filter gain to a copy of the input signal to obtain a filtered signal, the frequency-dependent filter gain being arranged to emphasize frequencies within a predetermined frequency range, determining a signal strength of the filtered signal, and determining the gain factor from at least the signal strength.

If the frequency-dependent filter is applied to a copy of the output signal, the method may be referred to as a feedback method. Such feedback method may thus comprise receiving the input signal, amplifying the input signal with a gain factor to obtain the output signal, and applying a frequency-dependent filter having a transfer function with a frequency-dependent filter gain to a copy of the output signal to obtain a filtered signal, the frequency-dependent filter gain being arranged to emphasize frequencies within a predetermined frequency range, determining a signal strength of the filtered signal, and determining the gain factor from at least the signal strength.

Hereafter, the at least one of a copy of the input signal and a copy of the output signal may be referred to as "the copy signal".

Compared to a prior art method, where the gain factor may be determined using a signal strength of the copy signal, the method may thus provide a gain factor which is determined from the filtered signal. When the copy signal comprises frequencies within the predetermined frequency range, the filtered signal may be different from the copy signal. Hereto, the frequency-dependent filter may be configured to emphasize certain frequencies in obtaining the filtered signal from the copy signal. If the certain frequencies are present in the copy output signal, these are emphasized in the filtered signal.

The determined signal strength may then be larger compared to the signal strength that would be obtained without such frequency-dependent filter (or equivalently, with a filter with a flat frequency response). Additionally or alternatively, the frequency-dependent filter may be configured to reduce certain frequencies in the filtered signal, whereby the determined signal strength is decreased relative to the signal strength that would be obtained without such frequency-dependent filter.

The gain factor that is determined from the signal strength of the filtered signal may thus differ from the gain factor that would be obtained without such frequency-dependent filter. In particular, the relationship between the signal strength and the gain factor may be such that the gain factor is lower for larger signal strength, and such that the gain factor is larger for smaller signal strength: when the frequency-dependent filter would then be configured to emphasize certain frequencies, the gain may then only be reduced more when such certain frequencies are present than when such certain frequencies are absent. In prior art methods however, the gain will be reduced to suit the worst-case situation, i.e., will always be maximally reduced.

The above-mentioned aspects thus allow providing an output signal with an increased output signal level, especially when certain frequencies are absent from the output signal. The certain frequencies may e.g. correspond to frequencies, which may result in a distorted output of the transducer, which may also be referred to as frequencies for which the transducer has a non-linear behavior, or as frequencies, which cause the transducer to introduce harmonic distortion. Emphasizing such frequencies in obtaining the filtered signal may then reduce the output signal level to prevent distortion only when the frequency content of the output signal so requires. The use of the frequency-selective filter may thus account for effects of frequency-selective non-harmonic behavior in the output of the transducer, i.e., account for a performance characteristic of the transducer such as e.g. a total harmonic distortion (THD) characteristic defining total harmonic distortion in the output of the transducer as a function of frequency of the signal delivered to the transducer. The use of the frequency-selective filter may alternatively or additionally account for other unwanted behavior. Thus, according to certain aspects, the performance characteristic of the transducer relates to a total harmonic distortion characteristic of the transducer. Alternatively or in addition, the performance characteristic of the transducer relates to any other unwanted behavior, such as—where the transducer comprises a speaker—resonant frequencies in the speaker's acoustic cabinet, speaker voice coil temperature etc.

According to an aspect, the frequency-dependent filter gain for frequencies within the predetermined frequency range is larger than the frequency-dependent filter gain for frequencies outside the predetermined frequency range. The frequency-dependent filter gain for frequencies outside the predetermined frequency range may e.g. be within the range of −3 dB to substantially 0 dB, such as substantially 0 dB, and the frequency-dependent filter gain for at least part of the frequencies within the predetermined frequency range may e.g. be within the range of 0 dB to +24 dB, preferably within the range of +3 dB to +12 dB, and preferably with a maximum filter gain in the range of +6 dB to +9 dB.

The signal strength may comprise at least one of a signal level and a signal power of the filtered signal.

According to further aspects, the method comprises delivering the output signal to a transducer having a performance characteristic, the frequency-dependent filter gain being arranged in consideration of the performance characteristic of the transducer. The performance characteristic of the transducer may correspond to a performance measure of the transducer as a function of frequency. The performance measure of the transducer may e.g. relate to a total harmonic distortion (THD) of the transducer and the performance characteristic of the transducer may e.g. relate to a total harmonic distortion (THD) characteristic of the transducer, i.e. total harmonic distortion of the transducer as a function of frequency. Herein, total harmonic distortion (THD) may e.g. be defined as a ratio of a sum of all powers of higher harmonic frequencies of a fundamental frequency in a transducer output signal to a power of the fundamental frequency in the transducer output signal. The skilled person will appreciate that different definitions of THD are used in the art and may be used alternatively, e.g. a ratio of a sum of all powers of higher harmonic frequencies of a fundamental frequency in a transducer output signal to a sum of a power of the fundamental frequency and all powers of higher harmonic frequencies in the transducer output signal, or, equivalently, the ratio of a difference of a total power minus the power of the fundamental frequency and a total power when a pure sine signal at the fundamental frequency is delivered to the transducer. Total harmonic distortion may alternatively be defined as an amplitude ratio rather than a power ratio.

The method may further comprise applying a delay to the input signal before amplifying the input signal. The delay may e.g. be obtained using a so-called look-ahead buffer.

According to an aspect, the frequency-dependent filter gain is arranged to emphasize frequencies with an emphasize bandwidth around at least one emphasize frequency with an emphasize gain in the range of 0 dB to 24 dB at the emphasize frequency. The transfer curve may e.g. comprise a peak with such center frequency and emphasize gain.

According to a further aspect, a method of amplifying of an input signal to obtain an output signal is described, the method comprising:
  a. receiving the input signal having an input frequency content,
  b. amplifying the input signal with a gain factor to obtain the output signal having an output frequency content, and
  c. determining the gain factor in consideration of a presence of at least one frequency within a predetermined frequency range in at least one of the input frequency content and the output frequency content.

The determining the gain factor in consideration of the presence of at least one frequency within the predetermined frequency range may comprise:
  a. applying a frequency-dependent filter having a transfer function with a frequency-dependent filter gain to the at least one of a copy of the input signal and a copy of the output signal to obtain a filtered signal, the frequency-dependent filter gain being arranged to emphasize frequencies within the predetermined frequency range,
  b. determining a signal strength of the filtered signal, and
  c. determining the gain factor from at least the signal strength.

According to another aspect, an amplifier circuit for amplifying an input signal to obtain an output signal is described, the amplifier circuit comprising:
  a. an amplifier arranged to receive the input signal and to amplify the input signal with a gain factor to obtain the output signal,
  b. an output terminal arranged to receive the output signal from the amplifier and allowing to connect to a transducer to, during use, deliver the output signal to the transducer, c. a filter arranged to receive at least one of a copy of the input signal and a copy of the output signal and to apply a frequency-dependent filter having a transfer function with a frequency-dependent filter gain to the at least one of a copy of the input signal and a copy of the output signal to obtain a filtered signal, the frequency-dependent filter gain being arranged to emphasize frequencies within a predetermined frequency range, and d. a level detector arranged to acquire the filtered signal and to determine a signal strength of the filtered signal, and e. a gain controller arranged to receive the signal strength, to determine the gain factor from at least the signal strength and to deliver the gain factor to the amplifier.

The filter may comprise a memory unit arranged to store and retrieve filter parameters of the frequency-dependent filter.

The amplifier circuit may further comprise a delay unit arranged to apply a delay to the input signal, and the amplifier may be arranged to amplify the input signal after the delay has been applied to the input signal. The delay unit may provide a so-called look-ahead buffer, allowing delaying the input signal with a time delay that is substantially equal to a settling time of amplifier and filter.

The amplifier circuit may be arranged to be connected to a transducer having a performance characteristic, and the frequency-dependent filter gain being arranged in consideration of the performance characteristic of the transducer. The frequency-dependent filter may correspond to a function of the performance characteristic of the transducer, such as a first constant times the performance characteristic of the transducer, such as a sum of a first constant times the performance characteristic of the transducer plus a second constant, or another function. For example, expressing the frequency-dependent filter gain as $G(\omega)$ and using a total harmonic distortion characteristic $THD(\omega)$ as the performance characteristic, a function fn could e.g. relate the frequency-dependent filter gain $G(\omega)$ to the total harmonic distortion characteristic $THD(\omega)$ as:

$$G(\omega)=fn(THD(\omega)),$$

$$G(\omega)=a \cdot fn(THD(\omega)), \text{ or}$$

$$G(\omega)=a \cdot fn(THD(\omega))+\beta,$$

wherein a and β are pre-determined frequency-independent constants, or a and β are predetermined frequency-dependent functions $a(\omega)$ and $\beta(\omega)$.

The performance characteristic of the transducer may e.g. relate to a total harmonic distortion characteristic of the transducer.

The amplifier circuit may be arranged to perform a method according to any of the aspects described above.

An amplifier circuit for amplifying an input signal to obtain an output signal may be provided, the amplifier circuit comprising:

a. an amplifier arranged to receive the input signal with an input frequency content and to amplify the input signal with a gain factor to obtain the output signal with an output frequency content, b. an output terminal arranged to receive the output signal from the amplifier and allowing to connect to a transducer to, during use, deliver the output signal to the transducer, and c. a gain determiner arranged to determine the gain factor in consideration of a presence of at least one frequency within a predetermined frequency range in at least one of the input frequency content and the output frequency content, and to deliver the gain factor to the amplifier.

The gain determiner may comprise:

a. a filter arranged to receive a copy of the input signal or a copy of the output signal and to apply a frequency-dependent filter having a transfer function with a frequency-dependent filter gain to the at least one of a copy of the input signal and a copy of the output signal to obtain a filtered signal, the frequency-dependent filter gain being arranged to emphasize frequencies within the predetermined frequency range, and b. a level detector arranged to acquire the filtered signal and to determine a signal strength of the filtered signal, and c. a gain controller arranged to acquire the signal strength, to determine the gain factor from at least the signal strength, and to deliver the gain factor to the amplifier.

According to a further aspect, a device is described, the device comprising an amplifier circuit according to any of the aspects described above and a transducer, the amplifier circuit being connected to the transducer and arranged to deliver the output signal to the transducer.

The transducer may comprise at least one of a speaker arranged to output sound depending on the output signal, an echo-canceling circuit arranged to provide echo cancellation using the output signal, a telephone hybrid circuit arranged to receive the output signal as an analogue signal to transform the output signal into a digital signal.

According to a further aspect, a method of defining a frequency-dependent filter is described. The method is for use in a method according to any of the methods described above or for use in an amplifier circuit according to any of the amplifier circuits described above, the method comprising:

a. obtaining a performance characteristic of the transducer from measuring a performance measure of the transducer as a function of frequency, using a transducer that is representative of a transducer to be connected during use to the amplifier circuit, b. defining the frequency-dependent filter as a function of the performance characteristic.

The performance characteristic may e.g. correspond to the THD characteristic, allowing defining the frequency-dependent filter such that frequencies at which the transducer introduces harmonic distortion are emphasized in the filtered signal if such frequencies are present, whereby the signal strength may be increased, and consequently the gain may be reduced.

The method of defining a frequency-dependent filter for use in a method according to any of the methods described above or for use in an amplifier circuit according to any of the amplifier circuits described above, comprises:

a. obtaining a performance characteristic of the transducer from measuring a performance measure of the transducer as a function of frequency, using a transducer that is representative of a transducer to be connected during use to the amplifier circuit, b. determining at least one extreme in the performance characteristic and a reference level of the performance characteristic, and c. defining the frequency-dependent filter such that at least one extreme and the reference level of the performance characteristic are reflected in corresponding extremes in the frequency-dependent filter.

The extremes may e.g. correspond to frequencies where the THD characteristic shows a peak, e.g. where the total harmonic distortion reflects a resonance. The reference level may e.g. correspond to an average level of the performance characteristic, or to a lower floor (or base level) of the performance characteristic.

According to a further aspect, a computer program on a computer-readable medium is described, the computer program to be loaded by a system comprising a processing unit and a memory, the processing unit being connected to the memory, and the computer program after being loaded allowing the processing unit to carry out the method according to any one of the methods described in the present document.

According to a further aspect, a computer-readable medium being provided with a computer program in accordance with the above mentioned computer program is described.

Embodiments are described by the dependent claims and in the detailed description. Effects and advantages of embodiments may be described, using examples, in the detailed description.

The invention will hereinafter be explained in detail with reference to several figures. The figures show forms of embodiment only, and are not intended as limitation of the inventive idea, which is determined by the appended claims. Technically equivalent solutions are deemed to fall within the scope of the claims. Embodiments may be combined to form further embodiments.

BRIEF DESCRIPTION OF DRAWINGS

The invention will be explained in detail with reference to some drawings that are only intended to show embodiments of the invention and not to limit the scope. The scope of the invention is defined in the annexed claims and by its technical equivalents.

The drawings show.

DETAILED DESCRIPTION OF EMBODIMENTS

Figure 1:
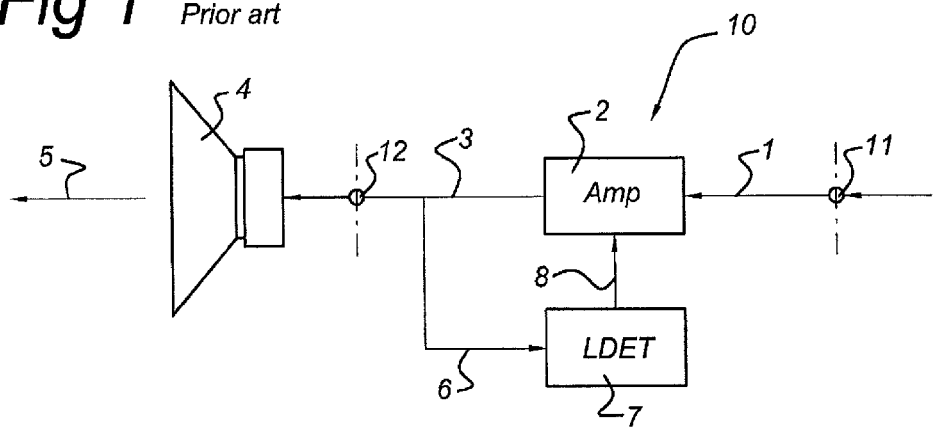
FIG. 1 schematically shows an amplifier circuit of the feedback type according to the prior art.
Figure 3:
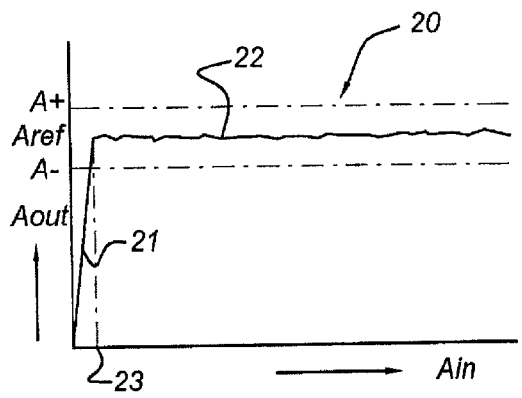
FIG. 3 schematically shows an amplifier characteristic of an amplifier circuit according to the prior art.
Figure 4:
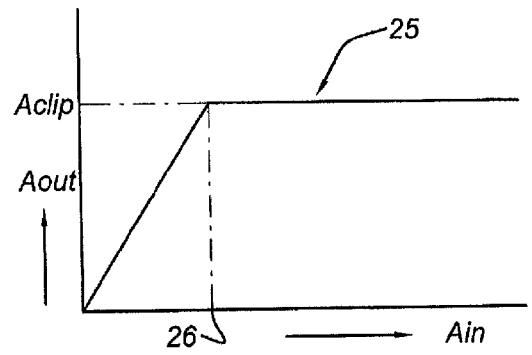
FIG. 4 schematically shows an alternative amplifier characteristic of an amplifier circuit according to the prior art.

FIG. 1 schematically shows an amplifier circuit 10 of the feedback type according to the prior art. The amplifier circuit 10 has an amplifier 2 arranged to receive an input signal 1 from an input terminal 11. In the example shown, the input signal 1 is an analog signal, but in alternative prior art examples, the input signal could be a digital signal. The amplifier 2 amplifies the input signal 1 with a gain factor, which may be referred to as g, to obtain an output signal 3. In the following, the gain factor may also be referred to simply as gain. The gain factor is in this example a frequency-independent value, i.e. all frequency components of the input signal 1 are multiplied with the same gain factor. The output signal 3 is provided via an output terminal 12 to a transducer 4, in the example illustrated as a speaker 4. The transducer 4 transforms the output signal 3 into a transducer output signal 5. E.g., when the transducer 4 is a speaker, the transducer output signal 5 corresponds to sound. The amplifier circuit 10 further has a level detector 7, which receives a feedback signal 6, which is obtained as a copy of the output signal 3. The level detector 7 determines a signal strength from detecting a level of the feedback signal 6, e.g. from determining a root-mean-square average over a predetermined period of time of the feedback signal 6. The level detector 7 feeds the signal strength as a strength signal 8 to the amplifier 2. The amplifier 2 further determines the gain g signal strength using a gain controller provided as part of the amplifier 2. The gain controller of the amplifier 2 may e.g. determine the gain g such that the relationship between level Aout of the output signal 3 and level Ain of input signal 1 is as shown in FIG. 3 or FIG. 4 (see below). The amplifier circuit 10 is known as an example of an Automatic Gain Control circuit, abbreviated as AGC.

Figure 2:
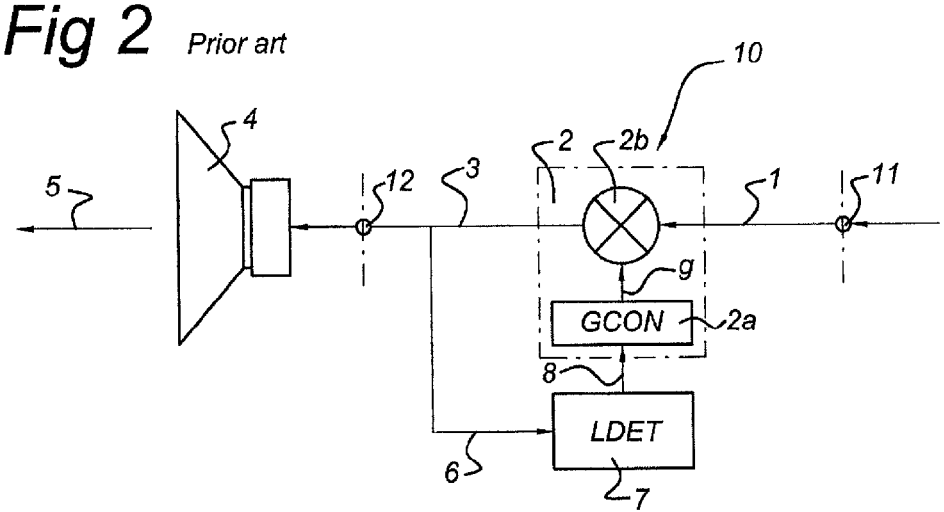
FIG. 2 schematically shows an exemplary amplifier circuit according to the prior art.

FIG. 2 schematically shows an exemplary amplifier circuit 10 according to the prior art. FIG. 2 shows the same elements as FIG. 1, but in the example of FIG. 2, the amplifier 2 used in the amplifier circuit 10 of FIG. 1 is shown to have a gain controller 2a and a multiplier 2b. The gain controller 2a may determine the gain g, using the signal strength such that the relationship between level Aout of the output signal 3 and level Ain of input signal 1 is as shown in FIG. 3 or FIG. 4 (see below). In determining the gain g, the gain controller 2a may use an earlier determined gain g, and update the gain g based on the signal strength. The multiplier 2 is arranged to multiply the input signal 1 with the gain g to obtain the output signal 3. While determining the gain g, the gain controller may further determine threshold values, such as a maximum level to which the output signal 3 is to be limited.

FIG. 3 schematically shows an amplifier characteristic 20 of an amplifier circuit 10 according to the prior art. The amplifier characteristic 20 shown in FIG. 3 is for example used where the transducer 4 comprises a transmitter. In this example, the transmitter is designed to operate optimally around a reference level Aref of the output signal 3 received by the transmitter. The amplifier characteristic 20 shows the level of the input signal 1 as level Ain along the horizontal axis, and the level of the output signal 3 as level Aout along the vertical axis. The amplifier characteristic 20 relates to the situation wherein the amplifier circuit 10 has had sufficient time to settle after a change in input signal level. The amplifier characteristic 20 shows a relationship between level Aout of the output signal 3 and level Ain of input signal 1, wherein the level Aout of the output signal 3 is kept between an upper limit A+ and a lower limit A− for any level Ain of the input signal 1, when larger than a first threshold 23 that is very close to zero (i.e., substantially as long as an input signal is present). The amplifier characteristic 20 thus has a substantially flat part 22 for all substantially non-zero Ain levels, and a steep initial part 23 for levels Ain below the first threshold 23. The level Aout of the output signal 3 is thus maintained at the approximately constant level Aref.

FIG. 4 schematically shows another amplifier characteristic 25 of an alternative amplifier circuit 10 according to the prior art. The amplifier characteristic 25 shown in FIG. 4 is for example used where the transducer 4 is a speaker. In this example, the speaker is designed to operate optimally from a zero-level of the output signal 3, corresponding to silence, to usually a maximum level Aclip of the output signal 3, corresponding to a sound level of the transducer output signal 5 with a maximum acceptable distortion. The amplifier characteristic 25 shows the level of input signal 1 as level Ain along the horizontal axis, and the level of output signal 3 as level Aout along the vertical axis. The amplifier characteristic 20 relates to the situation wherein the amplifier circuit 10 has had sufficient time to settle after a change in input signal level. The amplifier characteristic 25 shows a relationship between level Aout of the output signal 3 and level Ain of input signal 1, wherein the level Aout of the output signal 3 is substantially proportional to the level Ain up to the level Aclip of the output signal, corresponding to a threshold 26 of level Ain. The level Aout of the output signal 3 is thus substantially maximized (which may also be referred to as limited or clipped) to level Aclip.

Figure 5:
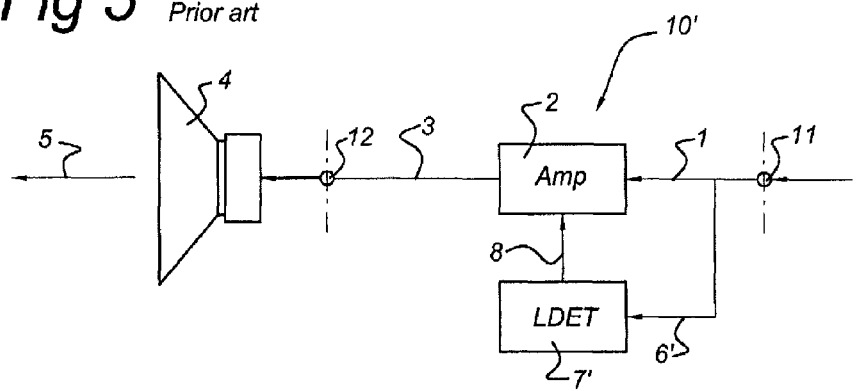
FIG. 5 schematically shows an amplifier circuit of the feedforward type according to the prior art.

FIG. 5 schematically shows a feedforward-type exemplary amplifier circuit 10' according to the prior art. FIG. 5 shows similar elements as the feedback-type exemplary amplifier circuit 10 of FIG. 1, but in the example of FIG. 5, the amplifier further has a level detector 7', which receives a feedforward signal 6', which is obtained as a copy of the input signal 1. The level detector 7' may e.g. determine the signal strength of the feedforward signal 6' and feed the signal strength as a strength signal 8 to the amplifier 2. The amplifier 2 may, using its gain controller, determine the gain g from the signal strength represented by the strength signal 8. The gain may e.g. be determined such that the relationship between level Aout of the output signal 3 and level Ain of the input signal 1 is as shown in FIG. 3 or FIG. 4 (see below). The amplifier circuit 10' is also known as an example of an Automatic Gain Control circuit.

Thus, in prior art systems, A+ (FIG. 3) and Aclip (FIG. 4) are usually designed such that the signal level of the output signal 3 is limited to remain below a certain maximum level, such as Aclip in FIG. 4. The certain maximum level is usually designed such that the transducer 4 transforms the output signal 3 into the transducer output signal 5 substantially within a predetermined performance of the transducer for any possible input signal 1. The predetermined performance of the transducer corresponds, e.g., to a transformation with substantially no distortion for any possible input signal 1.

Figure 6:
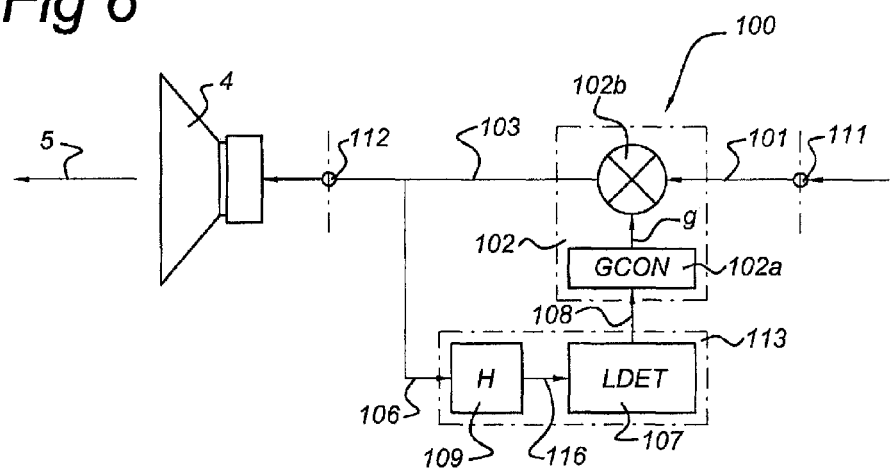
FIG. 6 schematically shows an amplifier circuit of the feedback type according to an embodiment.

FIG. 6 schematically shows an exemplary amplifier circuit 100. The amplifier circuit 100 has an amplifier 102 (which may be similar to the amplifier circuit 2 of FIG. 1) arranged to receive an input signal 101 from an input terminal 111. In the example shown, the input signal 101 is an analogue signal, but in alternative examples, the input signal could be a digital signal. The amplifier 102 amplifies the input signal 101 with a gain factor, which may be referred to as g, to obtain an output signal 103. The gain factor is in this example a frequency-independent value, i.e. all frequency components of the input signal 1 are multiplied with the same gain factor. The output signal 103 is connected, via an output terminal 112, to a transducer 4, in the example illustrated as a speaker 4. The transducer 4 transforms the output signal 3 into a transducer output signal 5. E.g., when the transducer 4 is a speaker, the transducer output signal 5 corresponds to sound.

The amplifier circuit 100 further has a filter 109 arranged to receive a feedback signal 106, which is obtained as a copy of the output signal 3, and to apply a frequency-dependent filter to obtain a filtered signal 116. The frequency-dependent filter has a transfer function with a frequency-dependent filter gain. The frequency-dependent filter gain may be arranged to emphasize frequencies within a predetermined frequency range. The amplifier circuit 100 further has a level detector 107, which receives the filtered signal 116. The level detector 107 detects signal strength of the filtered signal. The signal strength may be a level of the filtered signal 116, and may be detected e.g. from determining an average of amplitude over a predetermined period of time of the filtered signal 116. The signal strength may alternatively relate to a signal power, which may be detected e.g. from determining a root-mean-square average over a predetermined period of time of the filtered signal 116. The level detector 107 determines the signal strength of the filtered signal 116 and feeds the signal strength as a strength signal 108 to the amplifier 2. The amplifier 102 determines, using its gain controller 102a, the gain g from the level of the filtered signal 116 and uses the gain g as thus determined to amplify the input signal 101 to obtain the output signal 103, e.g. using a multiplier 102b. The gain controller 102a may e.g. determine the gain g such that the relationship between level Aout of the output signal 3 and level Ain of input signal 1 is as shown in FIG. 3 or FIG. 4 (see above). The filter 109 and the level detector 107 thus cooperate as a gain determiner 113 to determine the gain g. The amplifier circuit 100 thus differs from the amplifier circuit 10 of FIG. 2 at least in that the amplifier circuit 100 further has a filter 109 which is arranged to apply a frequency-dependent filter to the copy of the output signal 106 to obtain a filtered signal 116, and in that the level detector 107 uses the filtered signal 116 rather than the copy of the output signal 106. The frequency-dependent filter applied by filter 109 may be designed according to a predetermined specification. The frequency-dependent filter may e.g. correspond to emphasizing (i.e., enhancing) specific frequencies to obtain a filtered signal with an increased level and a corresponding reduction of the gain, compared to the prior art, whereby the output signal is e.g. only reduced when such specific frequencies are present. In such case, the gain is not reduced when such specific frequencies are not present, which results in a larger output signal level. Hereby, the output signal level may be maximized substantially within the operating range of the transducer 4. The frequency-dependent filter may thus e.g. emphasize specific frequencies corresponding to frequencies where the transducer shows unwanted behavior, such as where the transducer shows distortion and/or where the transducer shows a resonance such as resonant frequencies in the speaker's acoustic cabinet and/or where the transducer shows unwanted behavior of non-acoustic nature such as in unwanted effects in speaker voice coil temperature. The frequency-dependent filter may reflect the performance characteristic of the transducer 4, i.e. have a similar spectral shape as the performance characteristic between output signal 102 and transducer output signal 5. The performance characteristic may e.g. correspond to the THD characteristic, which may be represented as THD($j\omega$), wherein $\omega$ denotes the frequency and wherein THD(jω) is a real number. The frequency-dependent filter may be determined in consideration of the THD characteristic. The frequency-dependent gain of the frequency-dependent filter may be referred to as "emphasize gain function" or "filter gain", and will be denoted with |H(jω)|, wherein ω denotes the frequency. The frequency-dependent filter gain may alternatively be referred to with G(ω).

The emphasize gain function |H(jω)| may e.g. be determined from the THD characteristic THD(jω) as:

$|H(j\omega)|=a*(1-THD(j\omega))$, $|H(j\omega)|=a+b*THD(j\omega)$, $|H(j\omega)|=a+b*\sqrt{THD(j\omega)}$, $|H(j\omega)|=c+d*(1-THD(j\omega))$, $|H(j\omega)|=c+d*/THD(j\omega)$, or other, e.g. higher-dimensional, functions of THD(jω), with a, b, c and d denoting constants. In the example functions, THD(jω), is defined as a power ratio of the sum of the higher-harmonic frequencies and the fundamental frequency, and designed to be 0 in the absence of any total harmonic distortion.

Alternatively, the emphasize gain function |H(jω)| may e.g. be determined from the THD characteristic THD(jω) and its average value, expressed as THDavg, e.g. as:

$|H(j\omega)|=\max(THD(j\omega),THDavg)/THDavg$.

Instead of using the average value, THDavg could be replaced by a minimum THD value across the frequencies ω, i.e. min (THD(jω)). In another alternative, a target THD value could be used instead of THDavg.

The skilled person will appreciate how to design corresponding functions for other definitions of THD(jω). The frequency-dependent filter may be implemented as an analogue filter or a digital filter. A digital frequency-dependent filter is preferably an infinite impulse response (IIR) filter, but may in alternative embodiments be a finite impulse response filter (FIR) or another suitable filter. An example of the frequency-dependent filter is given in FIG. 10b and will be discussed below. An example of the resulting amplifier characteristic 125 of amplifier circuit 100 is shown in FIG. 11.

Figure 10A:
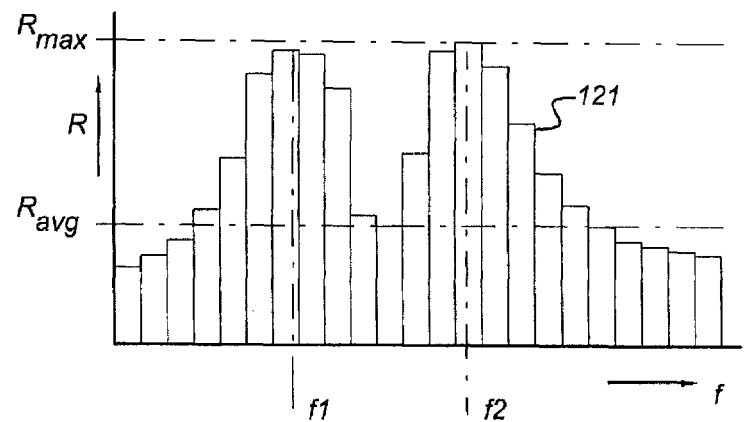
FIG. 10a schematically shows a performance characteristic of a transducer in an exemplary embodiment.

FIG. 10a schematically shows a performance characteristic 121 of an exemplary transducer. The horizontal axis corresponds to the frequency of a signal provided to the transducer, on a logarithmic scale. The vertical axis shows a measure of performance R, of the transducer output signal, on a logarithmic scale, wherein the performance decreases in the vertical direction along the vertical axis. The measure of performance shown in FIG. 10a corresponds e.g. to a measure of total harmonic distortion of the speaker when the transducer comprises a speaker, to a measure of echo distortion in a telephone hybrid circuit, or to a measure of attenuation of an echo canceling circuit when the transducer comprises an echo canceling circuit. The performance characteristic 121 shows the measure of performance R (such as total harmonic distortion in this example) as a function of the frequency of the signal provided to the transducer. It may be observed that the performance characteristic 121 shows two peaks at frequencies indicated with f1 and f2. It is shown that the performance characteristic 121 reaches a maximum value Rmax at frequency f2 (thereby indicating lowest performance as frequency f2).

FIG. 10a also indicates an average level Ravg corresponding to the average value of the performance characteristic 121. The average level Ravg may e.g. correspond to the average value THDavg described above, where the performance characteristic 121 relates to total harmonic distortion. Alternatively, the performance characteristic 121 of the corresponding transducer may relate to other measures of performance. E.g., the performance characteristic may correspond to a relative amplitude of the transducer output signal, which may show resonance frequencies.

Figure 10B:
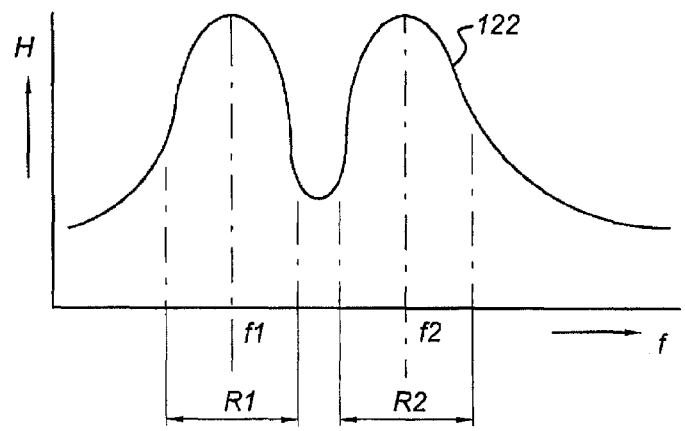
FIG. 10b schematically shows a frequency-selective filter of an exemplary embodiment.
Figure 11:
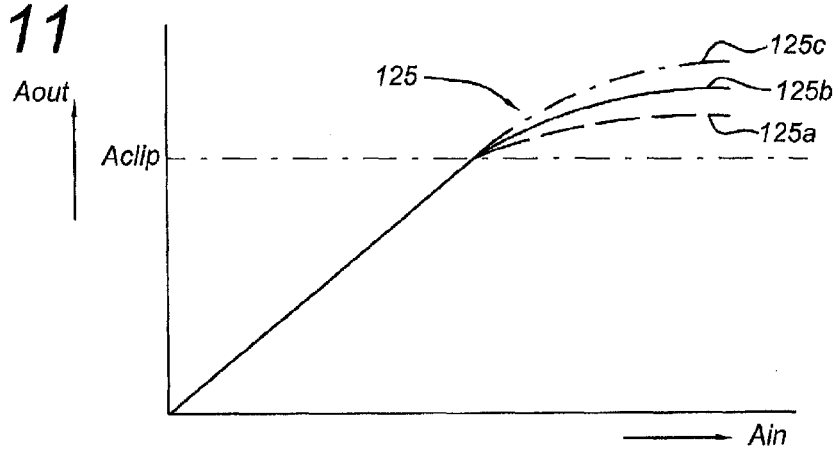
FIG. 11 schematically shows an effective filter characteristic of an amplifier circuit according to an embodiment.

FIG. 10b schematically shows an exemplary transfer function, also referred to as frequency-dependent filter curve 122, of a filter 109 designed to be used with a transducer having the performance characteristic 121 shown in FIG. 10a. The horizontal axis corresponds to the frequency of a signal provided to the filter, e.g. shown on a logarithmic scale. The vertical axis shows the relative filter amplification of the filter output signal, e.g. on a logarithmic scale. The exemplary frequency-dependent filter curve 122 shows the relative amplification as a function of the frequency of the signal provided to the filter and has two peaks at the frequencies corresponding to f1 and f2 of the performance characteristic 121 of the exemplary transducer of FIG. 10a. The exemplary frequency-dependent filter curve 122 thus emphasizes frequencies within a first predetermined frequency range R1 around center frequency f1 and within a second predetermined frequency range R2 around center frequency f2. The emphasize gain at frequencies f1 and f1 are in this example in the range of 6-9 dB, but could in alternative embodiments have other values, typically within the range of 0 dB to 24 dB. The first predetermined frequency range R1 and the second predetermined frequency range R2 may together be referred to as the predetermined frequency range. The frequency-dependent filter curve 122 or transfer function thus comprises a frequency-dependent filter gain arranged to emphasize frequencies within the predetermined frequency range. In this non-limiting example, the center frequencies f1 and f2 are approximately 800 Hz and 1300 Hz respectively with corresponding emphasis bandwidths (defined as full width half maximum) of approximately 75-100 HZ, and the predetermined frequency ranges R1 and R2 (also referred to as emphasis bandwidths) are each approximately 200 Hz. In other examples, the frequency-dependent filter gain may be arranged to emphasize frequencies within an emphasize bandwidth around a center frequency in the range of 100 Hz-2 kHz, with the emphasize bandwidth being in the range of 5-20% of the center frequency. In still other examples, the predetermined frequency range is a range within a frequency range of 40 Hz-40 kHz, preferably within a frequency range of 100 Hz-4 kHz.

FIG. 11 schematically shows an exemplary amplifier characteristic 125 of an amplifier circuit 100. The amplifier characteristic 125 shown in FIG. 11 is for example used where the transducer 4 is a speaker, and may be compared to amplifier characteristic 25 of the prior art shown in FIG. 4. The amplifier characteristic 125 shows the level of the input signal 1 as level Ain along the horizontal axis, and the level of the output signal 3 as level Aout along the vertical axis. The amplifier characteristic 125 shows a relationship between the level Aout of the output signal 103 and the level Ain of input signal 101, wherein the level Aout of the output signal 103 is substantially proportional to the level Ain up to a level Aclip of the output signal. Whereas in the prior art, the level. Aout of the output signal 103 is hereby substantially limited to remain below the level Aclip, the level Aout may continue to increase beyond Aclip especially when the output signal 103 has a relatively low abundance of frequency components at frequencies f1 and f2 (or, in general, of frequencies where the frequency-dependent filter curve 122 is relatively large) when using an amplifier circuit 100. FIG. 11a schematically shows three curves 125a, 125b, 125c corresponding to three different, and decreasing degrees of presence of frequencies components f1 and/or f2. It may be observed that the three curves show different improvements of resulting levels Aout of the output signal 103. It may be observed that the lowest degree of presence of the frequency components f1 and f2, i.e. where the transducer has a substantially flat performance as a function of frequency, e.g. is substantially free of harmonic distortion over the whole frequency range, the resulting output level Aout is increased most significantly relative to the prior art situation. The output signal level may thus be increased compared to the prior art for many input signals 101.

Figure 7:
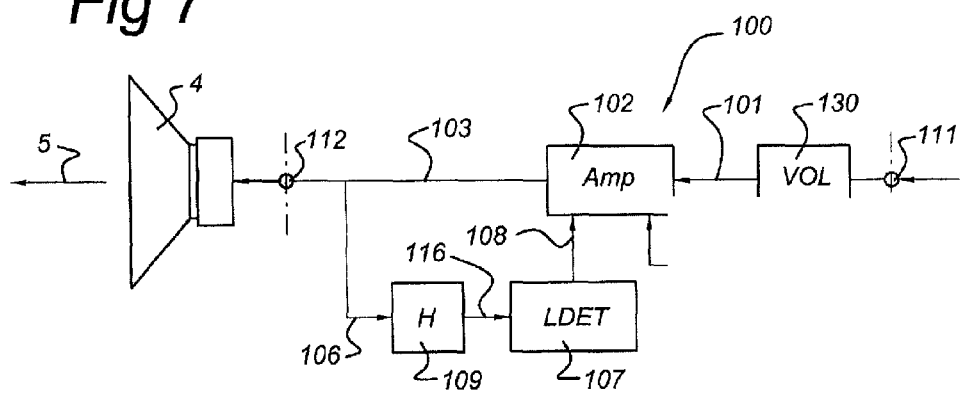
FIG. 7 and FIG. 8 schematically show amplifier circuits according to alternative embodiments.

FIG. 7 schematically shows another example amplifier circuit 100. FIG. 7 shows the same elements as FIG. 6, and further shows a volume controller 130 as part of the amplifier circuit 100. The volume controller 130 allows a user of a device with the amplifier circuit 100, to adjust the signal level of the input signal 101. The user may thus e.g. increase the volume of the speaker 5 (as long as the output signal is within the range where it is proportional to the input signal—refer to FIG. 4). The volume controller 130 may, alternatively, be automatically operated by a further unit in the device, e.g., when the transducer is a transmitter, the volume controller may be operated in dependence on the type of signal to be transmitted as is determined by the further unit. The volume controller 130 may be in communication with the amplifier 102 using a volume level signal 119 to provide the amplifier 102 with an indication of settings of the volume controller 130 via the volume level signal 119. This may allow the amplifier 102 to determine the gain also in consideration of the settings of the volume controller 130.

Figure 8:
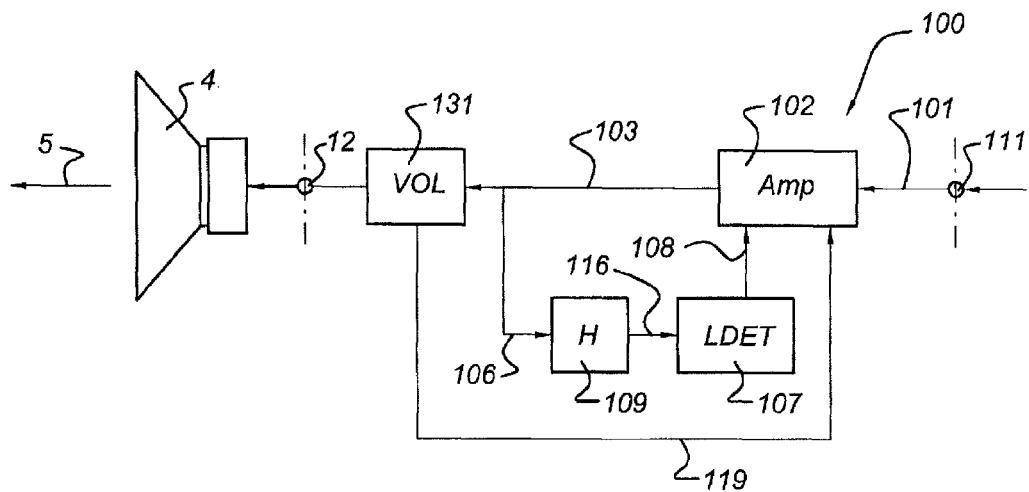

FIG. 8 schematically shows another example amplifier circuit 100. FIG. 8 shows the same elements as FIG. 7, but the position of the volume controller is changed compared to FIG. 7. The volume controller 131 of FIG. 8 allows a user of a device with the amplifier circuit 100, to adjust the signal level of the output signal 103 before the output signal is delivered to the transducer. The volume controller 131 is in communication with the amplifier 102, in particular its gain controller 102a, using a volume level signal 119 allowing the gain controller 102a. The volume level signal 119 comprises an indication of settings of the volume controller 130 via the volume level signal 119. This may allow the amplifier 102 to determine the gain also in consideration of the settings of the volume controller 131. The volume controller 132 may e.g. reduce the gain g in order to reduce the output signal level of the output signal 103 when the volume level signal 119 indicates a volume increase by the volume controller 131, and thereby to limit the level of the signal as delivered to the transducer 4.

Figure 9:
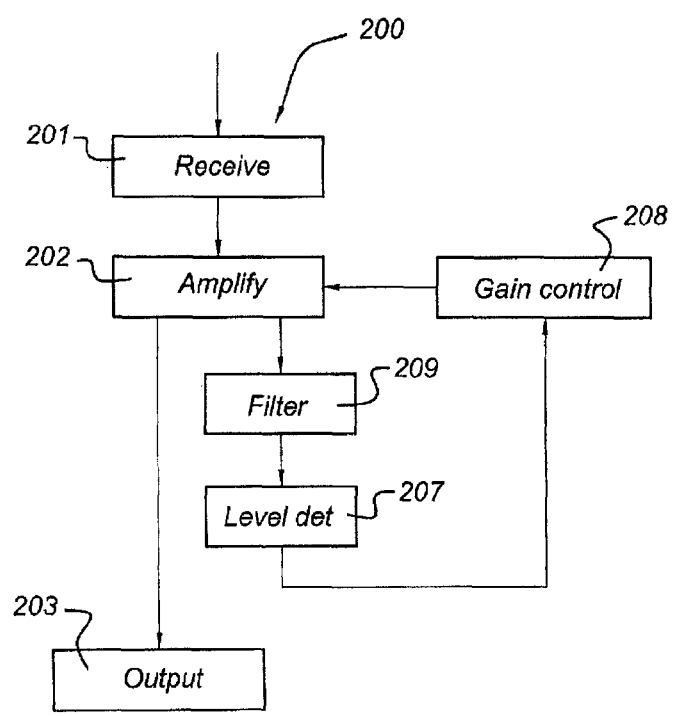
FIG. 9 schematically shows a method according to an embodiment.

FIG. 9 schematically shows an example method of amplifying of an input signal to obtain an output signal. The method comprises receiving 201 the input signal, amplifying 202 the input signal with a gain factor to obtain the output signal, and outputting 203 the output signal. The method further comprises applying 202 a frequency-dependent filter to a copy of the output signal to obtain a filtered signal. Alternatively, the method further comprises applying 202 a frequency-dependent filter to a copy of the input signal obtain the filtered signal. The method further comprises determining 207 signal strength of the filtered signal. The method further comprises determining 208 the gain factor from at least the signal strength.

Figure 12:
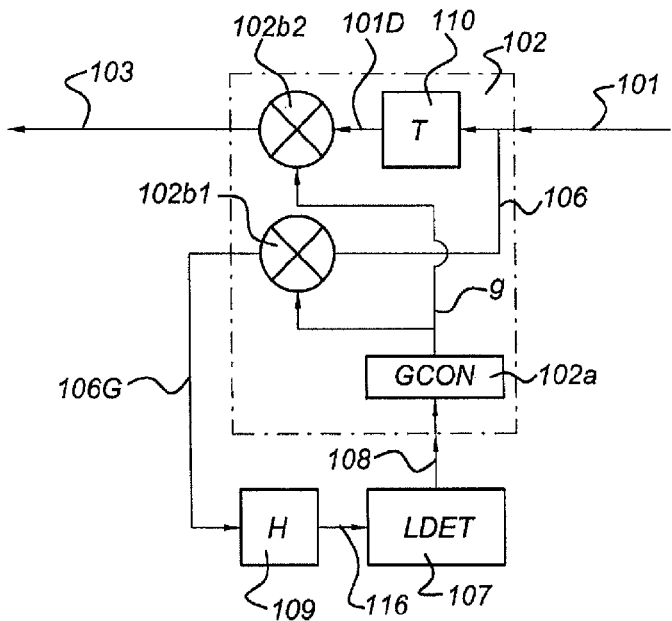
FIG. 12 schematically shows amplifier circuits according to alternative embodiments.

FIG. 12 schematically shows another example amplifier circuit. FIG. 12 shows similar elements as FIG. 6, indicated with the same reference numbers, and further shows a buffer 110 that is configured to delay the input signal 101 before being received by the amplifier 102 to be amplified with the gain factor to obtain the output signal 103. The buffer 110 is arranged to store the input signal 101 for a certain time after which the input signal is retrieved as a delayed input signal 101D. The delayed input signal 101D is then amplified with the gain as determined by the gain determiner 102a in the amplifier 102. The buffer 110 may be referred to as "look ahead buffer". The effect of using the look-ahead buffer is that the gain is effectively applied using a delayed version of the input signal. The delay provided by the look ahead buffer 110 is preferably approximately equal to the settling time of the filter 109 and the level detector 107, or, in general terms, determined in dependence on the relevant time constants of the filter's loop and gain. Filter 109 preferably has a minimal group delay, and may be implemented as an infinite impulse response (IIR) filter.

The amplifier 102 of FIG. 12 comprises a gain controller 102a and a first multiplier 102b1. During use, the first multiplier 102b1 receives a gain from the gain controller 102a, similar to multiplier 102b in FIG. 6, and multiplies the copy 106 of the input signal with the gain to obtain a gained input signal 106G. The gained input signal 106D is received by filter 109 which determines a filtered signal 116 similar to the situation in FIG. 6, wherein the filter 109 receives a gained copy of the output signal, i.e. the copy 106 of the output signal, and determines filtered signal 116. The level detector 107 receives the filtered signal 116 and determines a strength signal 108. The gain controller 102a receives the strength signal 108 from the level detector 107, and determines the gain factor g from at least the strength signal 108. The amplifier 102 further comprises a second multiplier 102b2, which receives the gain factor g from the gain controller 102a and the delayed input signal 101D from the look-ahead buffer 110, and applies the gain factor 9 to the delayed input signal 101D to obtain the output signal 103.

Figure 13A:
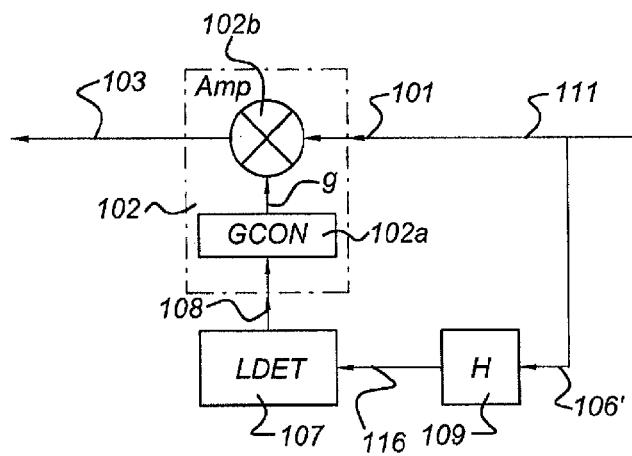
FIG. 13a and FIG. 13b schematically show amplifier circuits of the feedforward type according to alternative embodiments.
Figure 13B:
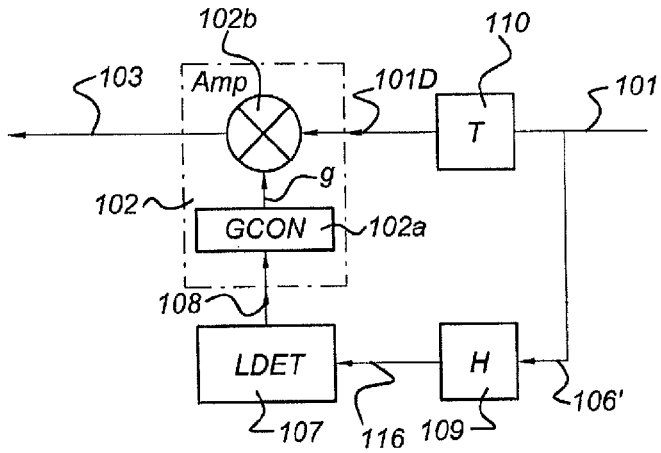

FIG. 13a and FIG. 13b schematically show further amplifier circuits. FIG. 13a and FIG. 13 represent feedforward versions of the amplifier circuits shown in FIG. 6 and FIG. 12, respectively.

FIG. 13a shows that, compared to the known amplifier circuit shown in FIG. 5, the amplifier circuit further comprises a filter 109 which is arranged to apply a frequency-dependent filter to a copy 106' of the input signal 101 to obtained a filtered signal 116, and the level detector 107 is arranged to receive the filtered signal 116 and to determine a strength signal 108 indicating a signal strength of the filtered signal 116 from the filtered signal 116. From the explanation given above for FIG. 6, as well as for prior art feedforward examples, the skilled person will understand the mode of operation of the feedforward version of FIG. 13a.

FIG. 13b shows an amplifier circuit of the feedforward type, which, compared to FIG. 13a, further comprises a buffer 110. The buffer 110 is arranged to delay the input signal 101, similar to the buffer 110 shown in FIG. 12, and may again be referred to as a "look ahead buffer" to obtain a delayed input signal 101D. The amplifier 102 is arranged to receive the delayed input signal 101D and to multiply the delayed input signal 101D with the gain factor g (determined from a signal strength of the filtered signal 116 obtained from applying a frequency-dependent filter to a copy 106' of the input signal) to obtain the output signal 103.

Figure 14A:
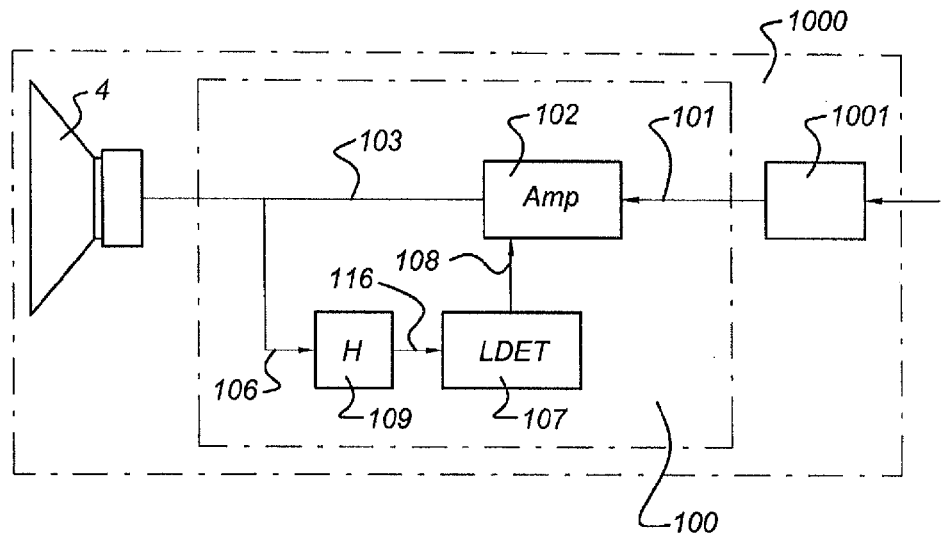
FIG. 14a-FIG. 14c schematically show devices according to embodiments.
Figure 14B:
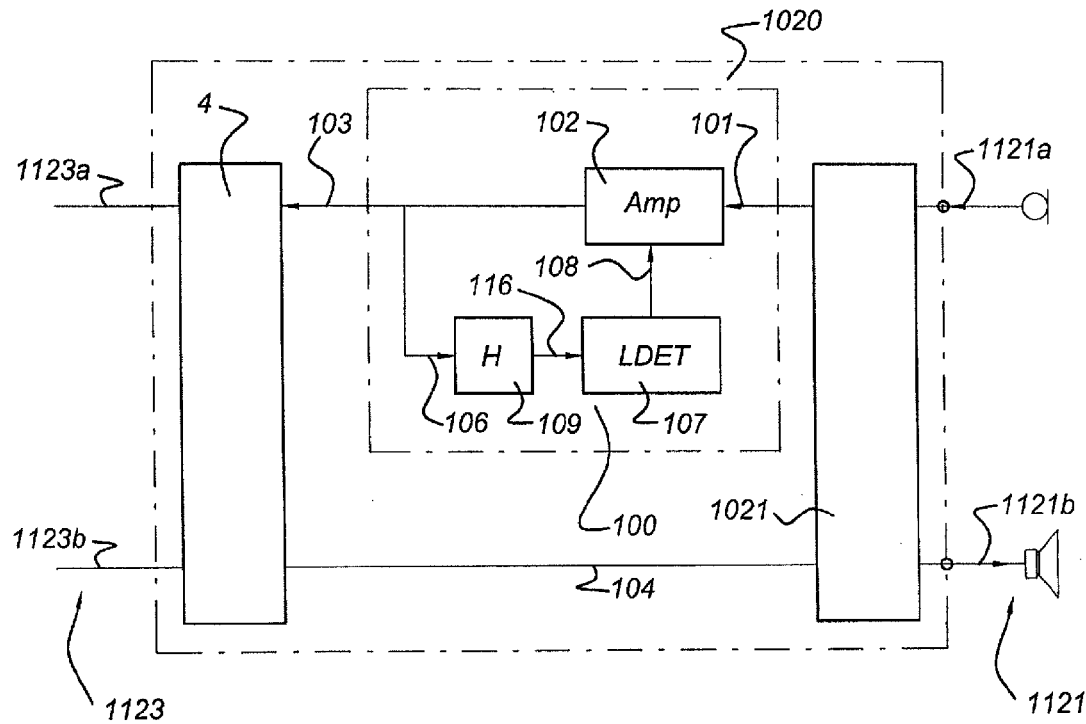
Figure 14C:
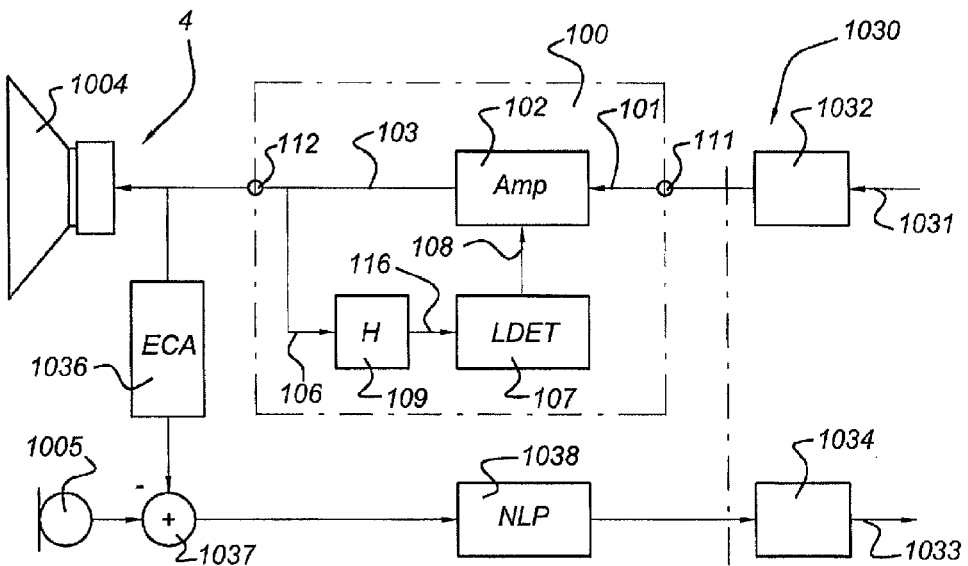

FIG. 14a-FIG. 14c schematically show various devices.

FIG. 14a shows a device 1000 with an amplifier circuit 100 and a transducer 4 connected to the amplifier circuit 100. The device 1000 further comprises additional circuitry 1001, e.g., comprising a storage unit, a signal source, a signal transceiver, a display unit, a user input interface, or the like.

FIG. 14b shows an example of a device 1020 that can be used in a Public Switched Telephone Network (PSTN). The device connects a 4-wire digital cable 1121 connecting to a digital network a 2-wire analogue telephone line 1123, e.g., a PSTN line connecting to a PSTN phone. The device 1020 receives digital telephone signals from a first wire 1121a of the 4-wire digital cable 1121 using a transceiver 1021, which routes the signal as input signal 101 to amplifier circuit 100. The amplifier circuit 100 are amplifier circuits 100 according to the circuits 100 described in the present document, preferably according to the same circuits 100, and comprise an amplifier 102 for receiving the input signal 101, a filter 109 for filtering output signals 103, and a level detector 107 for detecting the signal strength of the filtered signal obtained from the filter 109. The amplifier circuit 100 delivers the output signals 103 to a transducer 4. The transducer 4 comprises a telephone hybrid circuit. The output signal 103 is delivered as a digital signal to the telephone hybrid circuit 4 (For this purpose the hybrid circuit may comprise or may be preceded by a digital-to-analog converter). The telephone hybrid circuit 4 is arranged to receive the output signal 103 and to transform the output signals into an analogue PSTN signal, which is delivered via a 2-wire analogue line 1123. The telephone hybrid circuit 4 is arranged to receive a signal from the 2-wire line 1123 and to deliver the received signal as a digital signal 104 to the transceiver 1021, which drives a second line 1121b of the 4-wire digital cable 1121.

FIG. 14c shows an example of another device 1030. The device 1030 of FIG. 14c is used for echo cancellation in e.g. a telephone that can be operated in a hands-free mode. Device 1030 has an amplifier circuit 100 according to a circuit 100 described in the present document and a transducer 4 connected to the amplifier circuit 100. The telephone comprises a speaker 1004, a receiver 1032 for receiving an incoming signal 1031 representing an audio signal to be emitted by the speaker 1004, a microphone 1005 for receiving audio signals, notably speech of a user of the telephone, and a transmitter 1034 for transmitting an outgoing signal 1033 representing the audio signal received by the microphone 1005. The incoming signal 1031 and the outgoing signal 1033 may e.g. be wireless or wired signals. The transducer 4 shown in FIG. 14c comprises the speaker 1004 and the microphone 1005, as well as an echo cancellation filter 1036, an echo cancellation adder 1037 and a non-linear processor 1038. The echo cancellation filter 1036, an echo cancellation adder 1037 and a non-linear processor 1038 are arranged to cooperate to perform an acoustic echo cancellation of the audio signal transmitted by the speaker 1004 and (partially) received by the microphone 1005. Hereby, the audio signal generated by the speaker 1004 as far as received by the microphone 1005 is modeled by the echo cancellation filter 1036 and subtracted by the echo cancellation adder 1037 and processed by the non-linear processor 1038 to obtain a signal wherein the contribution of the audio signal generated by the speaker 1004 is largely cancelled and can be delivered by the non-linear processor 1038 to the transmitter 1034 to be transmitted substantially free from an echo component. Various implementations for such acoustic echo cancellation are known and will not be described here in more detail. The filter 109 in the amplifier circuit 100 may model a performance characteristic of the echo path from the speaker 1004 to the microphone 1005. Hereby, frequencies at which the speaker 1004 gives a distorted signal, e.g. quantified using a measure of total harmonic distortion, may be emphasized in the filtered signal 109, whereby the level detector 107 determines the signal strength in dependence on the filtered signal, and the gain controller controls the gain 108 delivered to the multiplier such that the gain may be reduced when signals with frequencies that may cause a distortion of the speaker output 1004 are present. Such signals could not only have an effect on the quality of the audio signal as heard by a user, but could also result in a mismatch between the modeling of the echo cancellation filter 1036 and the actual path contribution, as the modeling may e.g. be such that any harmonic distortion of the speaker 1004 is not accounted for. The skilled person may appreciate that similar embodiments may be used with transducers involving other types of echo cancellation, e.g., where the transducer comprises a receiver and a transmitter in e.g. a data network. It will further be appreciated that the device 1030 may further be adapted to comprise and operate with a volume controller as shown in FIG. 7 or FIG. 8.

Figure 15:
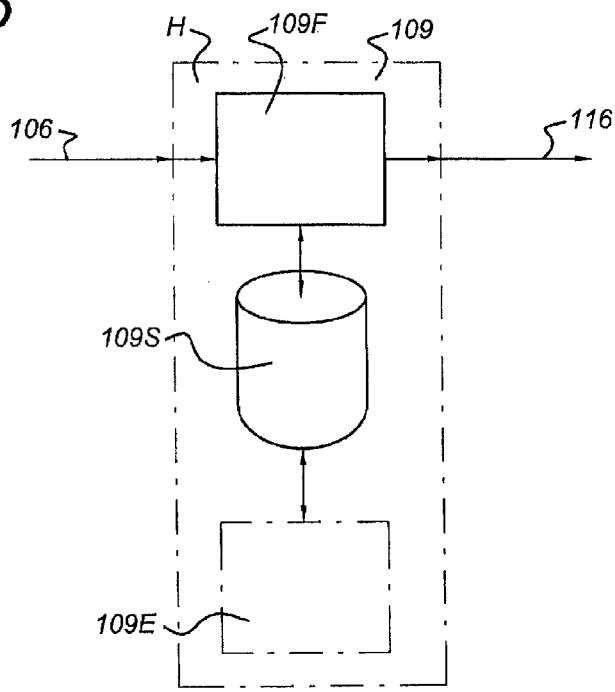
FIG. 15 shows an exemplary embodiment of a filter in an embodiment.

FIG. 15 shows an exemplary embodiment of filter 109. FIG. 15 shows a filter unit 109F. The filter unit 109F is capable of receiving the feedback signal 106 (or, alternatively, the feedforward signal 106') and of applying a frequency-dependent filter to the feedback signal to obtain the filtered signal 116. The filter unit 109F may e.g. comprise an analogue filter with a predetermined frequency response. The filter unit 109F may alternatively comprise an analogue filter with an adjustable frequency response, e.g. having adjustable resistors or other adjustable components for adapting the frequency response of the filter to the transducer that is connected to the amplifier circuit during use. Hereto, the filter unit 109F may comprise a filter memory 109S that can be read by the filter unit 109F to obtain a setting for the adjustable resistors or the other adjustable components. Alternatively, the filter unit 109F may comprise a digital filter with a plurality of filter taps, wherein values for the filter taps are stored in and retrieved from a filter memory 109S. The values for the filter taps may be stored directly, or in a parameterized format, e.g. using parameters indicating central frequencies and widths of a plurality of frequency peaks of a predetermined shape. The filter memory 109S could be readable and/or writable using an external configuration device 109E, by which a qualified user can configure the frequency-dependent filter according to the transducer that is connected to the amplifier circuit during manufacturing of a specific device, e.g. according to the performance characteristic of a connected speaker.

Figure 16:
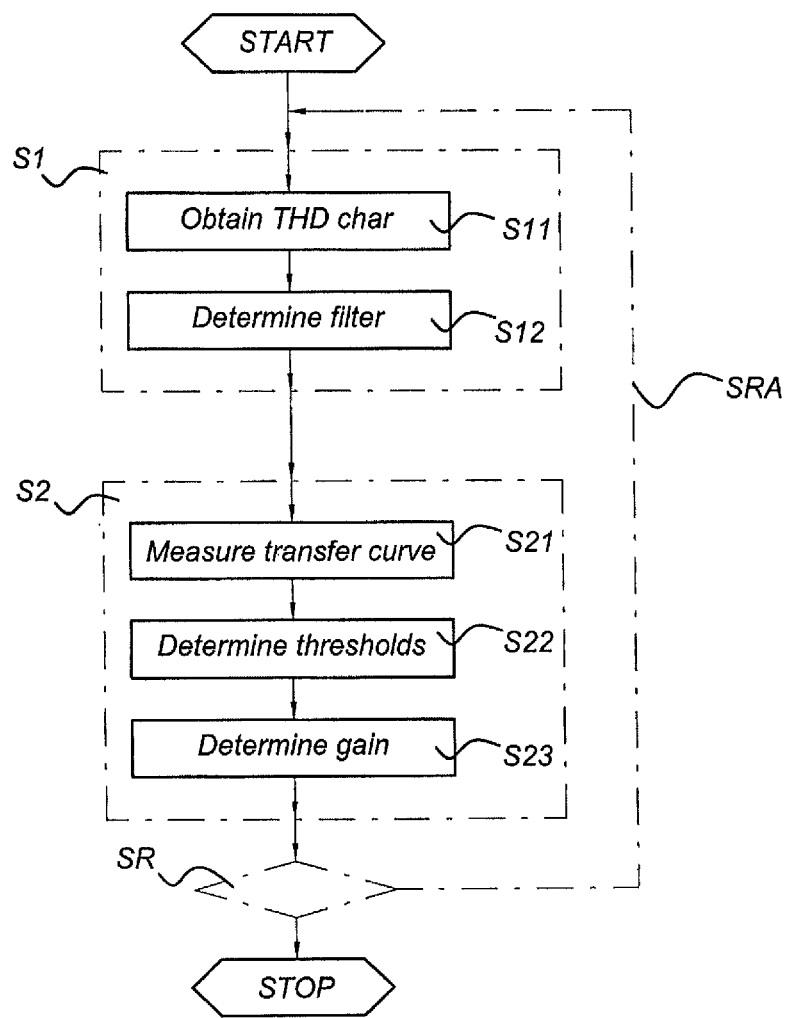
FIG. 16 schematically illustrates a method of configuring an amplifier circuit according to an embodiment.

FIG. 16 schematically illustrates a method of configuring an amplifier circuit. In the example, the transducer 4 comprises a speaker to illustrate the method, but the method may be used mutatis mutandis for other transducers. The method comprises configuring S1 the filter and configuring S2 the automatic gain circuit comprising the amplifier and the level detector. Herein, the output signal of the amplifier will be referred to as a speaker signal. The speaker signal thus corresponds, during later use, to the input signal amplified with the gain.

FIG. 16 shows that configuring S1 the filter may comprise obtaining S11 a performance characteristic of the speaker from measuring a performance measure of the speaker as a function of frequency, using a speaker that is representative of a speaker to be connected during use to the amplifier circuit; and defining S22 a frequency-dependent filter as a function of the performance characteristic. Hereby, extremes in the performance characteristic are reflected in corresponding extremes in the frequency-dependent filter. Also, the average level (or another suitable reference level such as a base level) of the performance characteristic is reflected in an average level of the frequency-dependent filter gain. The performance characteristic may e.g. correspond to a total harmonic distortion of speaker output as a function of frequency. Measuring the performance measure of the speaker as a function of frequency may e.g. be performed while operating the speaker at a nominal intended speaker level, i.e. at a speaker signal level with which the speaker would typically be operated by a user (or at least intended to be operated with). Alternatively, measuring the performance measure of the speaker as a function of frequency may e.g. be performed at a plurality of speaker signal levels, to obtain a frequency-dependent filter that also depends on the speaker signal level.

FIG. 16 shows that configuring S2 the automatic gain circuit may e.g. comprise measuring S21 speaker output level as a function of speaker signal level to obtain a speaker saturation curve; determining S22 from the speaker saturation curve a speaker saturation signal level corresponding to a maximum speaker signal level where the speaker output level has a saturation below a predetermined threshold; and determining S23 gain values as a function of input level supplied to the amplifier such that the speaker signal level is limited to remain below the maximum speaker signal level when the gain values are applied. The amplifier circuit, as thus configured, may be used to limit the speaker output level to remain below the predetermined threshold. E.g., the speaker may be operated in a regime wherein the speaker output level is substantially proportional to the speaker signal level, as the speaker signal level is limited to maintain below the speaker saturation signal level.

FIG. 16 further indicates with dashed box SR that the method may comprise determining SR whether configuring S1 the filter and configuring S2 the automatic gain circuit is to be repeated. If so, dashed arrow SRA indicated that the method may be executed in another iteration. The method may e.g. comprise multiple iterations with different signal levels applied to the speaker or for a plurality of operation conditions, such as a hands-free mode and a handheld mode of a speaker in a handheld phone, corresponding to different speaker output levels.

Figure 18:
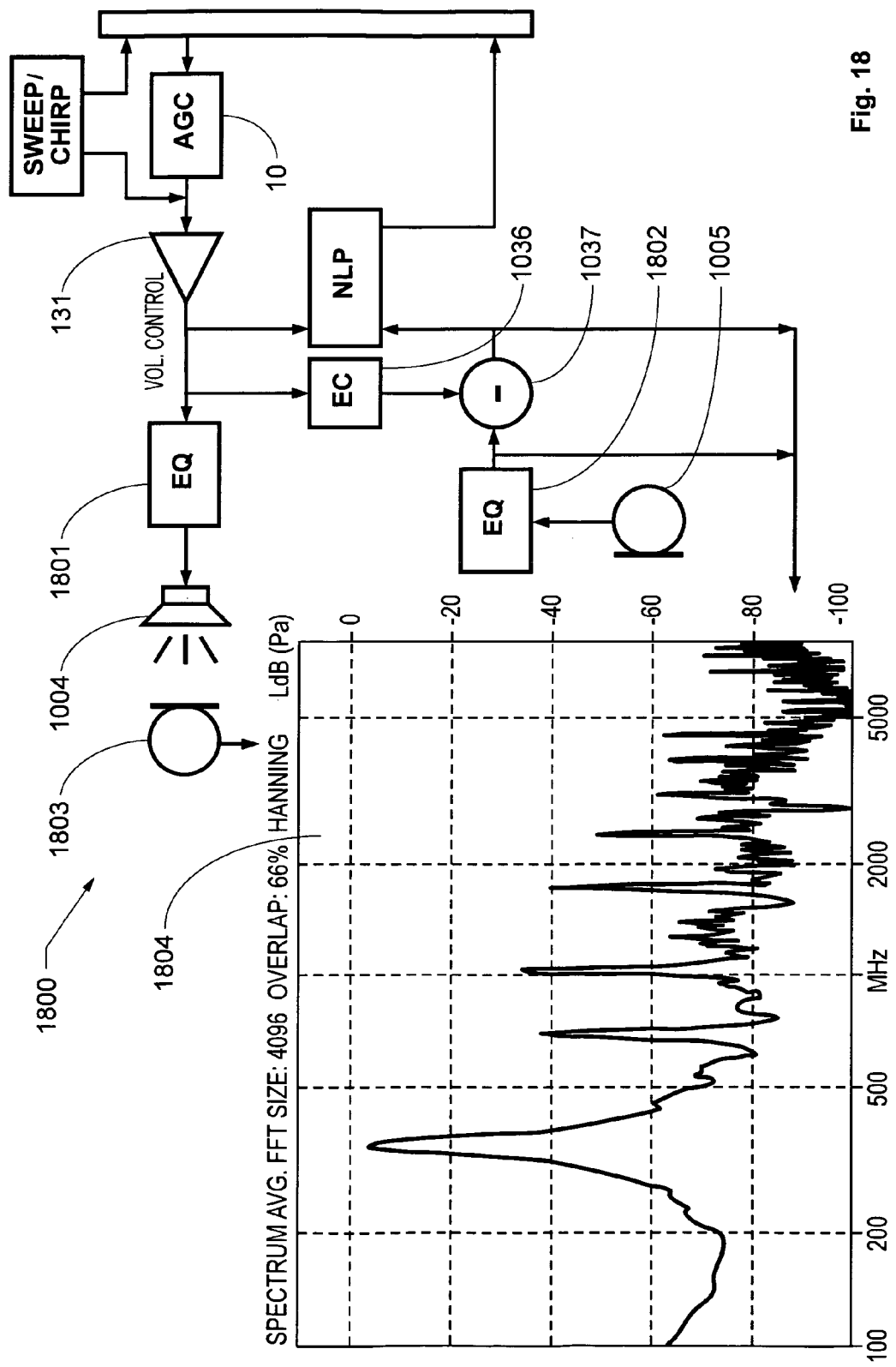
FIG. 18 schematically illustrates an example set-up for measuring a total harmonic distortion.

In FIG. 18, an example setup 1800 for measuring a total harmonic distortion (THD) characteristic of an example transducer 1004 (a speaker) and/or of the performance of an example echo canceller 1036 is illustrated. The setup 1800 comprises a signal path for generating a sweep of sinusoids at different frequencies (and/or possibly white noise). The signal path may comprise an AGC 10, a volume controller 131 and an equalization filter 1801. The emitted sweep of sinusoids (or the white noise) may be recorded using an external microphone 1803. The external microphone 1803 records the acoustic signal emitted by the speaker 1004, which is excited by a sinusoid at a particular frequency (or by the white noise). The emitted acoustic signal comprises signal power at the particular frequency. Furthermore, the emitted acoustic signal may comprise signal power at higher harmonic frequencies of the particular frequency (i.e. of the fundamental frequency). By way of example, the THD for the particular frequency may be determined as the ratio of the sum of all powers of the higher harmonic frequencies to the power of the particular frequency. An example THD characteristic 1804 is illustrated in FIG. 18.

Alternatively or in addition, the setup 1800 may be used to determine the echo canceller performance vs. frequency. For this purpose, the emitted sweep of sinusoids is recorded using the internal microphone 1005 of a telephone device comprising the speaker 1004 and the microphone 1005. The recorded audio signal may be processed by an equalization filter 1802. Subsequently, the recorded audio signal is corrected by the predicted signal at the output of the echo cancellation filter 1036 using the echo cancellation adder 1037. As outlined above, the echo-cancelled signal may comprise harmonic distortions, which are typically due to the distortions caused by the speaker 1004 (and by the entire device comprising the speaker 1004). The performance of the echo canceller may be determined as the ratio of the power of the echo cancelled signal and the power of the recorded signal prior to echo cancellation (i.e. prior to the adder 1037). If this performance measure is determined for a sweep of frequencies, a performance vs. frequency diagram 1804 is determined. Automatic Gain Control as outlined in FIG. 14c which is based on a filter 109 derived from the echo canceller performance can be used to improve the performance of duplexing in telephone networks using the above described telephone devices.

As outlined in the context of FIG. 16, the performance vs. frequency diagram 1804 may be determined for different speaker signal levels, i.e. for different settings of the volume controller 131. The volume settings are typically qualified in conjunction with the speaker 1004 and typically provide an indication of the sound pressure level (dB spl) generated by the speaker 1004. A relatively lower volume setting typically indicates higher headroom for the application of automatic gain control and vice versa.

As outlined in the context of FIGS. 10a and 10b, the THD vs. frequency or the echo canceller performance vs. frequency diagram 1804 can be used to determine an emphasize gain function $|H(j\omega)|$ and one or more peaking filters which approximate the emphasize gain function $|H(j\omega)|$. By way of example, the emphasize gain function $|H(j\omega)|$ is determined from the performance vs. frequency curve (referred to as $THD(j\omega)$) by the formula $|H(j\omega)|=\max(THD(j\omega), THDavg)/THDavg$ as described above. This results in an emphasize gain function $|H(j\omega)|$ which is equal to 1, whenever the performance curve is below its average value THDavg. In addition, the emphasize gain function $|H(j\omega)|$ typically comprises one or more bumps or elevations greater 1. Each of these bumps may represent a problem area (or predetermined frequency range such as R1 and R2), for which the speaker 1004 (and/or the device) creates undesirable distortions. Each problem area is described by a center frequency (also referred to as emphasis frequency) (f1, f2) and an emphasis bandwidth or Q value. It is proposed to model each of these problem areas by a dedicated peaking filter. This means, in case of N problem areas (N=1, 2, 3, 4, 5), N peaking filters are determine, wherein each peaking filter models the emphasize gain function of a corresponding one of the N problem areas. Typically, an IIR filter is used as a peaking filter. In particular, a second order (biquad) IIR filter may be used as a peaking filter. Also higher order IIR may be used as peaking filters. This may be particularly relevant for approximating a problem area with a high Q factor (i.e. with a high emphasis gain with a small emphasis bandwidth). The peaking filters may be designed such that the energy of the signal components lying within the problem area is amplified (e.g. in the range of 1 dB up to 12 dB), whereas the energy of the signal components outside of the problem area remains substantially unchanged. As such, the overall emphasize gain function $|H(j\omega)|$ can be approximated by a sequence of N peaking filters corresponding to the filter 109.

As indicated above, different performance curves 1804 may be determined for different volume settings of the volume controller 131. The volume setting dependent performance curves 1804 lead to volume dependent emphasize gain functions $|H(j\omega)|$, which in turn lead to volume dependent peaking filters 109. FIGS. 7 and 8 illustrate examples of amplifier circuits 100 which comprise volume controllers 130 and 131. Depending on the volume setting, the volume dependent peaking filters 109 may be used to determine a filtered signal 116 on which the signal strength 108 of the filtered signal 116 is determined using the level detector 107. As such, the signal strength 108 may depend on the volume settings of the volume controllers 130 and 131. Furthermore, the volume level signal 119 is provided to the amplifier 102, which can determine the gain g based on the signal strength 108 and based on the volume settings of the volume controller 130, 131.

Typically, the maximum gain value $g_{max}$ is set to 0 dB, i.e. at maximum gain $g_{max}$, the output signal corresponds to the input signal. Furthermore, a minimum gain value $g_{min}$ may be defined. The minimum gain value $g_{min}$ may be dependant on the volume setting of the volume controller 130, 131. A default minimum gain value $g_{min,default}$ may be defined for a maximum volume setting of the volume controller 130, 131. Typically, the default minimum gain value $g_{min,default}$ ensures that for a maximum volume setting the total harmonic distortion of the speaker 1004 (and of its cabinet) generated by the output signal (amplified by the volume controller 130, 131) is "just acceptable". This may e.g. be ensured if for all frequencies the total harmonic distortion of the speaker 1004 (or the device in total) is below a THD threshold. Alternatively, this may be ensured if the average THD (across all frequencies) is below a THD threshold. Alternatively, this may be ensured if for all frequencies the THD of the speaker 1004 (or device) lies below a frequency dependent THD threshold. The THD threshold may be set to 10-15% of THD (or lower).

The minimum gain value $g_{min}$ for volume settings other than the maximum volume setting can be determined by adjusting (increasing) the default minimum gain value $g_{min,default}$ in accordance to the actual volume setting. By way of example, if the actual volume setting indicates a lowering of the volume level by x dB, the minimum gain value $g_{min}$ can be increased by x dB compared to the default minimum gain value $g_{min,default}$ (e.g. x=2). A typical example for the default minimum gain value $g_{min,default}$ is −12 dB.

In the following, an example scheme for adjusting the gain g within the gain controller 102a is described. The example scheme makes use of the feedback ADC configuration depicted in FIG. 6. The example scheme makes use of an upper signal strength threshold $T_{high}$. The upper signal strength threshold $T_{high}$ may depend on the actual volume settings of the volume controller 130, 131. A default upper signal strength threshold $T_{high,default}$ may be defined for maximum volume settings. The default upper signal strength threshold $T_{high,default}$ corresponds to the signal strength 108 of the filtered output signal for which the total harmonic distortion of the speaker 1004 (and its cabinet/device) generated by the output signal is "just acceptable". Typically, the default upper signal strength threshold $T_{high,default}$ is proportional to the default minimum gain value $g_{min,default}$. By way of example, the default upper signal strength threshold $T_{high,default}$ and the default minimum gain value $g_{min,default}$ may be equal. The upper signal strength threshold $T_{high}$ for volume settings other than the maximum volume setting can be determined by adjusting (increasing) the default upper signal strength threshold $T_{high,default}$ in accordance to the actual volume setting. By way of example, if the actual volume setting indicates a lowering of the volume level by x dB, the upper signal strength threshold $T_{high}$ can be increased by x dB compared to the default upper signal strength threshold $T_{high,default}$ (e.g. x=2). A typical example for the default upper signal strength threshold $T_{high,default}$ is −12 dB.

In addition, a lower signal strength threshold $T_{low}$ may be defined. The lower signal strength threshold $T_{low}$ may be used to ensure stability within the gain controller 102a when setting the gain g. In particular, the lower signal strength threshold $T_{low}$ may be used to avoid an oscillation of the gain g. The lower signal strength threshold $T_{low}$ is usually chosen at 2-3 dB below the upper signal strength threshold $T_{high}$.

As outlined above (e.g. in the context of FIG. 6), the output signal 106 is filtered by an (possibly volume setting dependent) emphasizing filter 109 to yield a filtered signal 116. The level detector 107 determines a signal strength 108 (e.g. a RMS signal power) of the filtered signal 116. The gain controller 102a may compare the signal strength 108 to the upper signal strength threshold $T_{high}$ (and possibly to the lower signal strength threshold $T_{low}$). If the signal strength 108 is above the upper signal strength threshold $T_{high}$, this indicates that the (possibly volume controlled) output signal is likely to generate unpleasant distortions at the device (with the current volume settings). As a consequence, the gain g of the amplifier 102 should be lowered. In order to smoothen the gain adjustment process, this may be done by lowering the current gain by a fall gain step $\Delta g_{fall}$. As such, the gain at time instant n+1 ($g_{n+1}$) is determined from the gain at time instant n ($g_n$), as $g_{n+1}=g_n-\Delta g_{fall}$. The new gain is applied to the input signal to generate the attenuated output signal.

The above-mentioned scheme is iterated for a sequence of time instants n until the signal strength 108 falls below the upper signal strength threshold $T_{high}$. If the signal strength 108 is lower than the upper signal strength threshold $T_{high}$, the gain g may be re-increased by a rise gain step $\Delta g_{rise}$. However, in order to avoid an oscillation around the upper signal strength threshold $T_{high}$, it may be beneficial to make use of the lower signal strength threshold $T_{low}$. This means that, the gain g is only increased if the signal strength 108 falls below the lower signal strength threshold $T_{low}$. Overall, the control function of the gain controller 102a may be written as:

$$g_{n+1} = \begin{cases} g_n - \Delta g_{fall}, & s > T_{high} \\ g_n, & T_{low} \le s \le T_{high}, \\ g_n + \Delta g_{rise}, & s < T_{low} \end{cases}$$

with s being the signal strength 108. The iterative procedure ensures that the gain g is smoothly lowered (i.e. the attenuation is smoothly increased), if the signal strength indicates that the output signal is likely to result in distortions at the speaker 1004 (and its cabinet/device). The gain g is typically lowered (subject to the above mentioned conditions) down to the minimum gain value $g_{min}$. On the other hand, the gain g is smoothly increased, if the signal strength indicates the absence of distorting frequencies within the input/output signal. The gain g is typically increased (subject to the above mentioned conditions) up to the maximum gain value $g_{max}$ (typically 0 dB). The gain steps $\Delta g_{fall}$ and $\Delta g_{rise}$ may be selected differently. By way of example, $\Delta g_{fall}$ may be greater than $\Delta g_{rise}$ in order to ensure a relatively fast reaction to distortions. Alternatively, the gain steps $\Delta g_{fall}$ and $\Delta g_{rise}$ may be selected to be equal.

As described in relation with FIGS. 12 and 13b, the amplifier 102 may comprise a "look ahead buffer" 110. Such a buffer 110 may also be used in conjunction with a feedback scheme shown e.g. in FIG. 6 by using an addition multiplier 102b1 (see FIG. 12) for determining the (non-delayed) output signal, which is used for determining the gain g in an iterative manner. By using a buffer 110, distortions, which may be created by transient input signals, can be avoided, because the attenuation gain g is determined "in advance". Typically, a buffer 110 delays an input signal by approx. 5 ms.

It should be noted that a user may be provided with the possibility to select the minimum gain value $g_{min}$, in order to select a tradeoff between a degree of attenuation and the subjective audio (e.g. voice) quality. By way of example, the user may want to set the minimum gain value $g_{min}$ to −10 dB, in order to limit the maximum compression (attenuation) to −10 dB (as a higher compression might sound unpleasant).

Figure 19A:
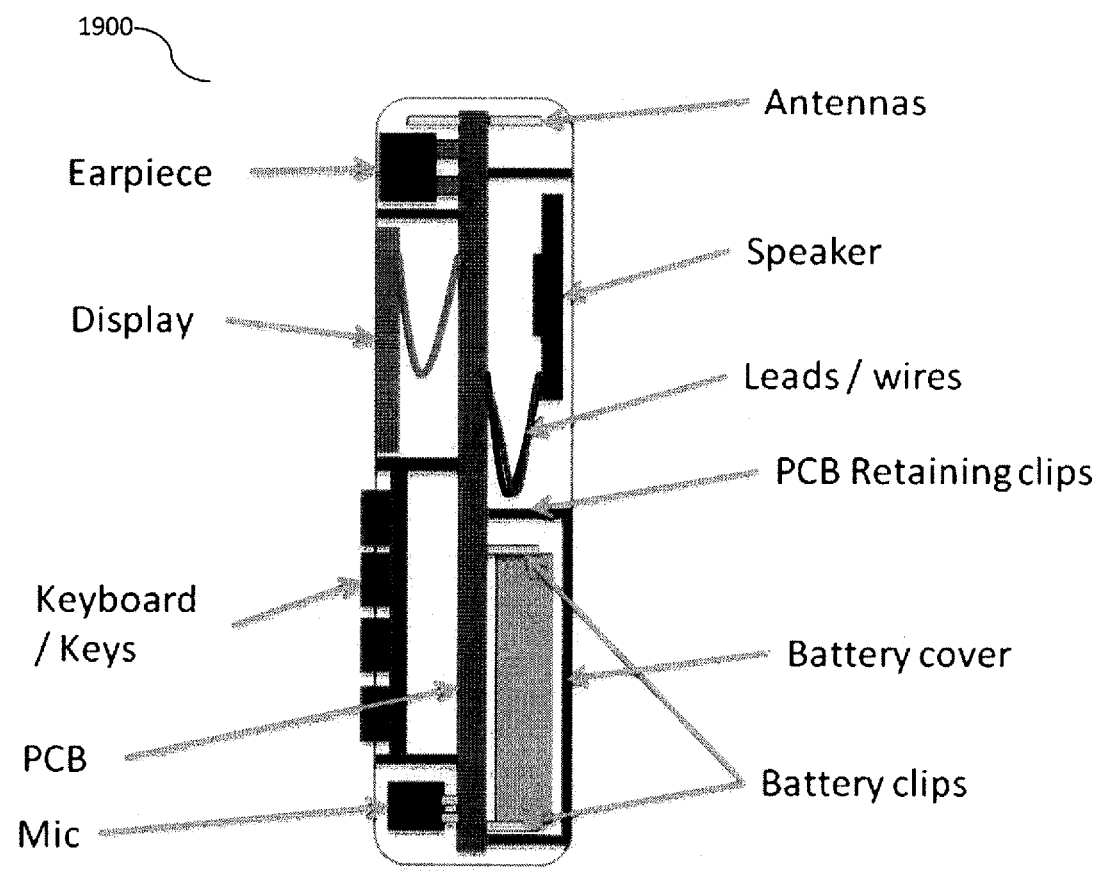
FIGS. 19a and b illustrate block diagrams of typical devices making use of the amplifier circuit described in the present document.
Figure 19B:
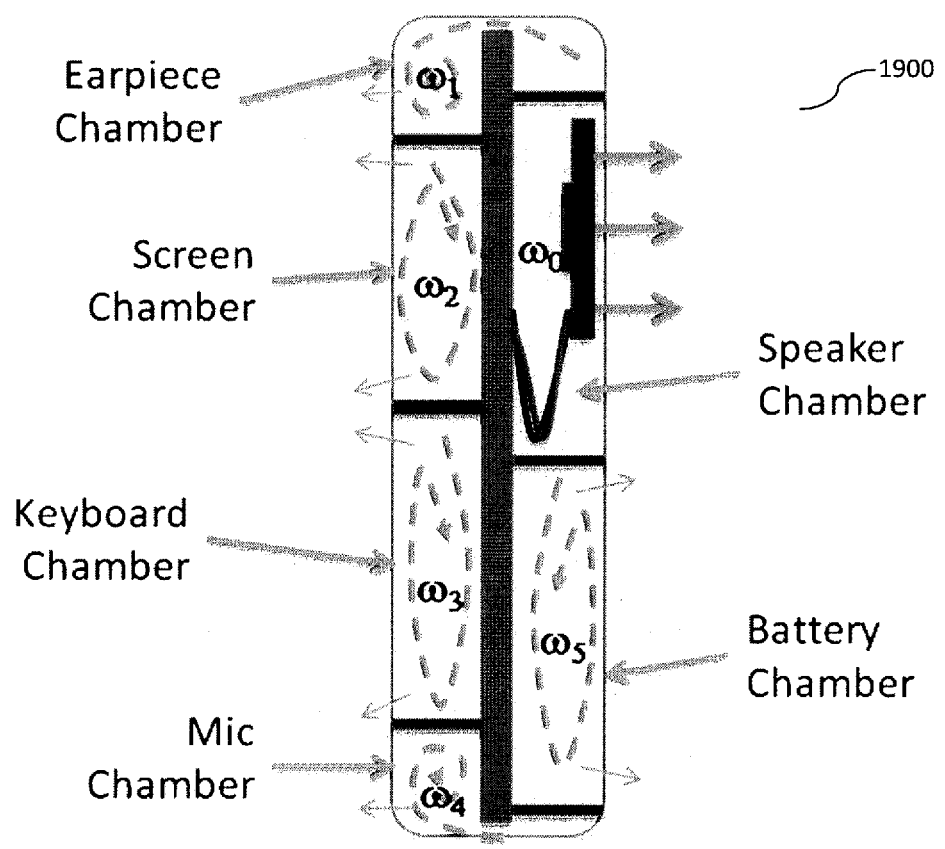

FIGS. 19a and b illustrate an example device 1900 within which the systems described in the present document may be used. The example device 1900 comprises a transducer (in the present example a speaker), which is surrounded by a cabinet (also referred to as an enclosure, casing or housing). The example device 1900 may be a cordless handset or a wireless telephone. The device 1900 may be subject to various mechanical resonances caused by the different components of the device, such as the keyboard and keys, the display, the printed circuit board (PCB), the wires and the leaded components, the mounted antennas, the battery clips & cover, and the telephone receiver. Furthermore, the device 1900 may be subject to various acoustic resonances in the various chambers within the device 1900 (see FIG. 19b). The combination of mechanical and acoustic resonances leads to a complex total harmonic distortion characteristic of the device 1900, as illustrated e.g. by the diagram 1804 in FIG. 18. This complex total harmonic distortion characteristic also impacts the echo cancellation performance in a similar manner.

Figure 17:
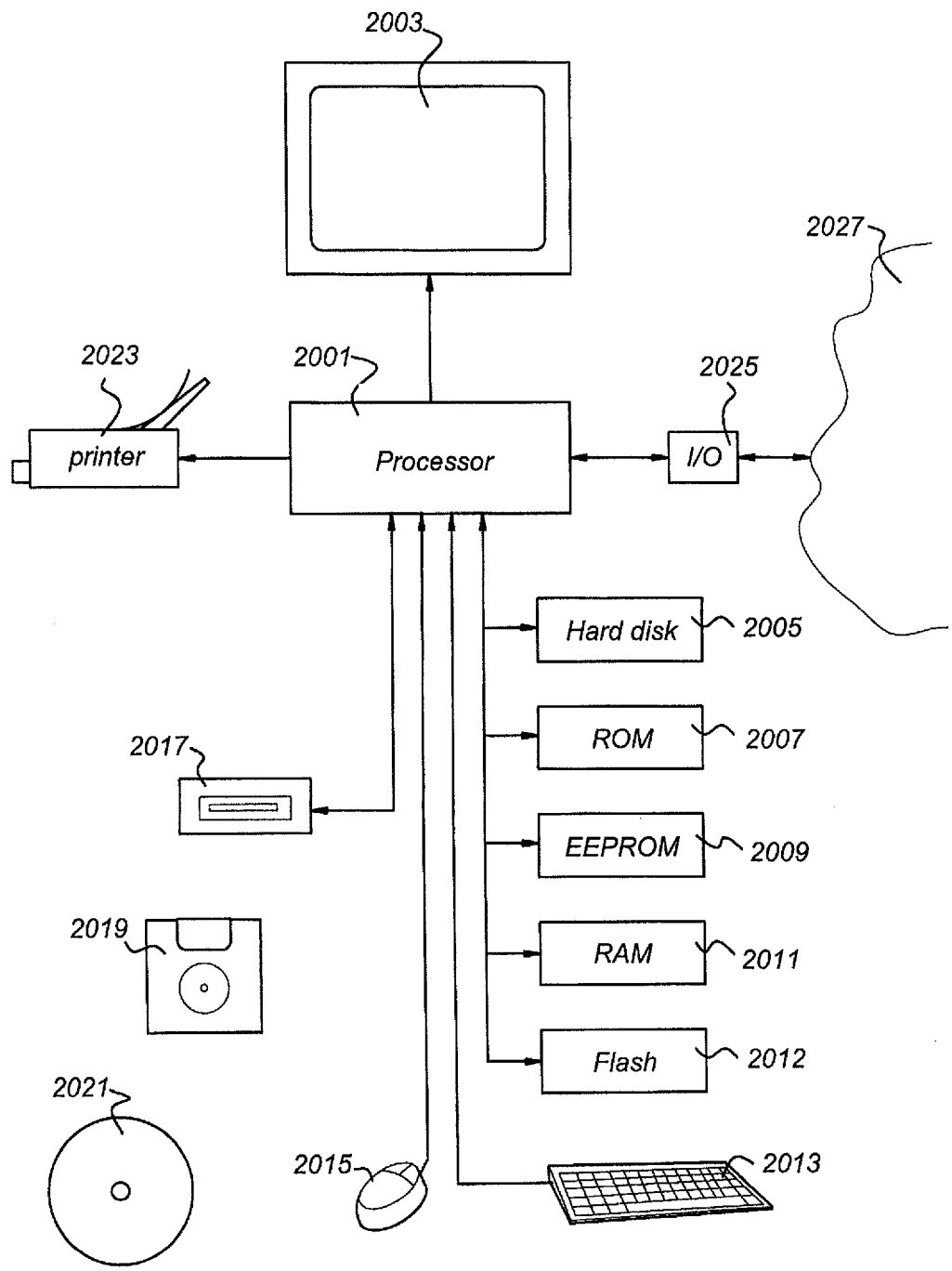
FIG. 17 schematically illustrates a computer arrangement.

In FIG. 17, an overview is given of a computer arrangement that can be used to carry out a method described in the present document. The computer arrangement shown in FIG. 17 is arranged to perform the exemplary method of FIG. 16. A similar computer arrangement may be usable to perform other methods or elements thereof, such as the method of amplification. The arrangement shown in FIG. 17 comprises a processor 2001 for carrying out arithmetic operations. The processor 2001 is connected to a plurality of memory components, including a hard disk 5, Read Only Memory (ROM) 2007, Electrically Erasable Programmable Read Only Memory (EEPROM) 2009, and Random Access Memory (RAM) 2011. Not all of these memory types need necessarily be provided. Moreover, these memory components need not be located physically close to the processor 2001 but may be located remote from the processor 2001. The processor 2001 is also connected to means for inputting instructions, data etc. by a user, like a keyboard 2013, and a mouse 2015. Other input means, such as a touch screen, a track ball and/or a voice converter, known to persons skilled in the art may be provided too. A reading unit 2017 connected to the processor 2001 is provided. The reading unit 2017 is arranged to read data from and possibly write data on a data carrier like a floppy disk 2019 or a CD 2021. Other data carriers may be tapes, DVD, BD, etc. as is known to persons skilled in the art. The processor 201 is also connected to a printer 2023 for printing output data on paper, as well as to a display 203, for instance, a cathode-ray tube monitor or a LCD (Liquid Crystal Display) screen, or any other type of display known to persons skilled in the art. The processor 2001 may be connected to a communication network 2027, for instance, the Public Switched Telephone Network (PSTN), a Local Area Network (LAN), a Wide Area Network (WAN), etc. by means of I/O means 2025. The processor 201 may be arranged to communicate with other communication arrangements through the network 2027. The data carrier 2019, 2021 may comprise a computer program product in the form of data and instructions arranged to provide the processor with the capacity to perform a method in accordance with the invention. However, such computer program product may, alternatively, be downloaded via the telecommunication network 2027. The processor 2001 may be implemented as standalone system, or as a plurality of parallel operating processors each arranged to carry out subtasks of a larger computer program, or as one or more main processors with several sub-processors. Parts of the functionality of the invention may even be carried out by remote processors communicating with processor 2001 through the network 2027. The processor 2001 may be included in a device, e.g. as a so-called embedded processor.

It will be appreciated that the elements described in the present document may be combined to form other methods or systems within the scope of the invention. Units described as separate units may be combined into one single unit. Units described as a single unit may be implemented using a plurality of units of different or equal type, which cooperate tom provide the function of the single unit.

Although the invention is described using specific embodiments, it will be clear that multiple methods and arrangements are possible within the scope of the invention. The skilled person will be able to combine, adapt, change or leave out one or more of the disclosed specific features of the embodiments.

While the invention has been particularly shown and described with reference to the preferred embodiments thereof, it will be understood by those skilled in the art that various changes in form and details may be made without departing from the spirit and scope of the invention.

What is claimed is:

1. A method of attenuating an input signal to obtain an output signal; wherein the input signal is an audio signal; the method comprising:
  receiving the input signal;
  attenuating the input signal with a gain factor to obtain the output signal;
  applying a filter having a frequency response with a frequency-dependent filter gain to at least one of a copy of the input signal and a copy of the output signal to obtain a filtered signal, the frequency-dependent filter gain being arranged to emphasize frequencies within a number N of predetermined frequency ranges, N>1; wherein the filter comprises a sequence of N sub-filters, each one of the N sub-filters having a frequency response adapted to emphasize frequencies within a corresponding one of the N predetermined frequency ranges; wherein the frequency-dependent filter gain is arranged in consideration of a performance characteristic of a transducer; wherein the transducer comprises a speaker adapted to render a signal derived from the output signal; wherein the transducer is part of a device comprising a microphone adapted to sense the rendered signal, and an echo cancellation circuit adapted to predict the sensed signal from the signal derived from the output signal; wherein the performance characteristic is obtained from measuring a performance of the echo cancellation circuit vs. frequency; wherein the performance of the echo cancellation circuit is determined as the ratio of the power of the sensed signal after echo cancellation and the power of the sensed signal prior to echo cancellation; wherein the N predetermined frequency ranges are determined such that the performance characteristic comprises a local maximum within each one of the N predetermined frequency ranges;
  determining a signal strength of the filtered signal; and
  determining the gain factor from at least the signal strength.

2. The method according to claim 1, wherein
  each of the N predetermined frequency ranges comprises an emphasize frequency and an emphasize bandwidth; and each of the corresponding N sub-filters is a biquad IIR filter approximating the emphasize frequency and the emphasize bandwidth.

3. The method according to claim 1, wherein the filter is applied to the copy of the output signal to obtain the filtered signal.

4. The method according to claim 1, wherein determining the gain factor comprises
comparing the signal strength to a higher signal strength threshold $T_{high}$; and
if the signal strength is above the higher signal strength threshold $T_{high}$ reducing the gain factor by a fall gain step $\Delta g_{fall}$.

5. The method according to claim 4, wherein determining the gain factor comprises
comparing the signal strength to a lower signal strength threshold $T_{low}$;
wherein the lower signal strength threshold $T_{low}$ is lower than the higher signal strength threshold $T_{high}$; and
if the signal strength is below the lower signal strength threshold $T_{low}$ increasing the gain factor by a rise gain step $\Delta g_{rise}$.

6. The method according to claim 5, wherein
the gain factor is limited to a maximum gain value $g_{max}$, with $g_{max}=0$ dB;
the gain factor is limited to a minimum gain value $g_{min}$;
the minimum gain factor $g_{min}$ is dependent on the performance characteristic of the transducer.

7. The method according to claim 5, further comprising
adjusting a signal level of the output signal using a volume controller; and
receiving a volume level signal comprising an indication of settings of the volume controller for adjusting the signal level of the output signal, wherein the higher signal strength threshold $T_{high}$ is determined based on the volume level signal.

8. The method according to claim 7, wherein
a default higher signal strength threshold $T_{high,default}$ defines the higher signal strength threshold $T_{high}$ for a maximum setting of the volume controller; and
the higher signal strength threshold $T_{high}$ determined based on the volume level signal is determined from the default higher signal strength threshold $T_{high,default}$ and a difference between the maximum setting of the volume controller and the setting of the volume controller indicated in the volume level signal.

9. The method according to claim 7, wherein the frequency-dependent filter gain depends on the adjusted signal level of the output signal.

10. A circuit for attenuating an input signal to obtain an output signal; wherein the input signal is an audio signal; the circuit comprising:

an amplifier arranged to receive the input signal and to attenuate the input signal with a gain factor to obtain the output signal;

an output terminal arranged to receive the output signal from the amplifier; wherein the output terminal is arranged to deliver the output signal to a transducer;

a filter arranged to receive at least one of a copy of the input signal and a copy of the output signal and to apply a filter having a frequency response with a frequency-dependent filter gain to the at least one of a copy of the input signal and a copy of the output signal to obtain a filtered signal, the frequency-dependent filter gain being arranged to emphasize frequencies within a number N of predetermined frequency ranges, N>1; wherein the filter comprises a sequence of N sub-filters, each one of the N sub-filters having a frequency response adapted to emphasize frequencies within a corresponding one of the N predetermined frequency ranges; wherein the frequency-dependent filter gain is arranged in consideration of a performance characteristic of the transducer; wherein the transducer comprises a speaker adapted to render a signal derived from the output signal; wherein the transducer is part of a device comprising a microphone adapted to sense the rendered signal, and an echo cancellation circuit adapted to predict the sensed signal from the signal derived from the output signal; wherein the performance characteristic is obtained from a measured performance of the echo cancellation circuit vs. frequency; wherein the performance of the echo cancellation circuit is determined as the ratio of the power of the sensed signal after echo cancellation and the power of the sensed signal prior to echo cancellation; wherein the N predetermined frequency ranges are determined such that the performance characteristic comprises a local maximum within each one of the N predetermined frequency ranges;

a level detector arranged to acquire the filtered signal and to determine a signal strength of the filtered signal; and a gain controller arranged to receive the signal strength, to determine the gain factor from at least the signal strength and to deliver the gain factor to the amplifier.

11. The circuit according to claim 10, wherein the filter comprises a memory unit arranged to store and retrieve filter parameters of the frequency-dependent filter.

12. The circuit according to claim 10, further comprising a delay unit arranged to apply a delay to the input signal, wherein the amplifier is arranged to attenuate the input signal after the delay has been applied to the input signal.

* * * * *